(12) United States Patent
Byun et al.

(10) Patent No.: US 12,058,897 B2
(45) Date of Patent: *Aug. 6, 2024

(54) DISPLAY DEVICE AND METHOD OF MANUFACTURING THE SAME

(71) Applicant: SAMSUNG DISPLAY CO., LTD., Yongin-si (KR)

(72) Inventors: Jinsu Byun, Yongin-si (KR); Taewook Kang, Yongin-si (KR); Hoon Kang, Yongin-si (KR); Gwangmin Cha, Yongin-si (KR); Saehee Han, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/065,898

(22) Filed: Dec. 14, 2022

(65) Prior Publication Data

US 2023/0209909 A1 Jun. 29, 2023

Related U.S. Application Data

(63) Continuation of application No. 16/991,800, filed on Aug. 12, 2020, now Pat. No. 11,557,636.

(30) Foreign Application Priority Data

Sep. 4, 2019 (KR) .......................... 10-2019-0109577

(51) Int. Cl.
*H10K 59/122* (2023.01)
*H10K 50/844* (2023.01)
(Continued)

(52) U.S. Cl.
CPC ......... *H10K 59/122* (2023.02); *H10K 50/844* (2023.02); *H10K 71/00* (2023.02); *H10K 59/1201* (2023.02); *H10K 2102/00* (2023.02)

(58) Field of Classification Search
CPC .. H10K 59/122; H10K 59/1201; H10K 71/00; H10K 50/844; H10K 2102/00
See application file for complete search history.

(56) References Cited

U.S. PATENT DOCUMENTS 9,196,664 B2 11/2015 Kim et al.
9,312,353 B2 4/2016 Jeong et al.
(Continued)

FOREIGN PATENT DOCUMENTS

CN 103872076 A 6/2014
CN 105529409 A 4/2016
(Continued)

OTHER PUBLICATIONS

Office Action dated May 13, 2024 in corresponding Chinese Patent Application No. 202010919739.8 (in Chinese), 13 pages.

*Primary Examiner* — Shaun M Campbell
(74) *Attorney, Agent, or Firm* — F. CHAU & ASSOCIATES, LLC

(57) ABSTRACT

A display device including a plurality of pixels over a substrate, the display device includes: a pixel-defining layer covering edges of a first electrode of each of the plurality of pixels; a first spacer arranged on the pixel-defining layer and including a first portion and a second portion, the first portion of the first spacer having a width increasing toward the substrate, and the second portion of the first spacer being arranged between the first portion of the first spacer and the substrate and having a width decreasing toward the substrate; and a first hole arranged apart from the first electrode between the plurality of pixels, the first hole being formed in the second portion of the first spacer and the pixel-defining layer.

20 Claims, 20 Drawing Sheets

(51) Int. Cl.
*H10K 59/12* (2023.01)
*H10K 71/00* (2023.01)
*H10K 102/00* (2023.01)

(56) References Cited

U.S. PATENT DOCUMENTS

| | | | |
|---|---|---|---|
| 10,026,791 | B2 | 7/2018 | Kim et al. |
| 10,205,122 | B2 | 2/2019 | Choi et al. |
| 10,312,470 | B2 | 6/2019 | Lee et al. |
| 10,452,182 | B2 | 10/2019 | Matsueda et al. |
| 10,658,443 | B2 | 5/2020 | Beak et al. |
| 10,727,439 | B2 | 7/2020 | Lim |
| 10,804,348 | B2 | 10/2020 | Kim |
| 11,844,239 | B2 | 12/2023 | Qin et al. |
| 2013/0099218 | A1 | 4/2013 | Lee et al. |
| 2014/0166999 | A1 | 6/2014 | Kim et al. |
| 2016/0013436 | A1 | 1/2016 | Im et al. |
| 2016/0013438 | A1 | 1/2016 | Im et al. |
| 2016/0079325 | A1 | 3/2016 | Lee et al. |
| 2016/0349899 | A1 | 12/2016 | Hwang et al. |
| 2018/0122877 | A1 | 5/2018 | Beak et al. |
| 2018/0261797 | A1 | 9/2018 | Lee |
| 2019/0173042 | A1* | 6/2019 | Lim ............ H10K 59/122 |
| 2019/0181205 | A1 | 6/2019 | Kim |
| 2019/0207150 | A1 | 7/2019 | Kwon et al. |
| 2021/0013296 | A1* | 1/2021 | Ochi ............ H10K 59/131 |
| 2021/0066419 | A1 | 3/2021 | Byun et al. |

FOREIGN PATENT DOCUMENTS

| | | |
|---|---|---|
| CN | 109216409 A | 1/2019 |
| CN | 110120464 A | 8/2019 |
| CN | 110137378 A | 8/2019 |
| JP | 2018-088391 A2 | 6/2018 |
| KR | 10-2008-0001263 | 1/2008 |
| KR | 10-2014-0075937 | 6/2014 |
| KR | 10-2017-0003768 | 1/2017 |
| KR | 10-2017-0041487 A | 4/2017 |
| KR | 10-2017-0059864 | 5/2017 |
| KR | 10-2017-0079529 | 7/2017 |
| KR | 10-2017-0128741 | 11/2017 |
| KR | 10-2017-0135587 | 12/2017 |
| KR | 10-2018-0047588 A | 5/2018 |
| KR | 10-2019-0066326 A | 6/2019 |
| KR | 10-2019-0067968 A | 6/2019 |

* cited by examiner

DISPLAY DEVICE AND METHOD OF MANUFACTURING THE SAME

CROSS-REFERENCE TO RELATED APPLICATION

This application is a continuation of U.S. application Ser. No. 16/991,800, filed on Aug. 12, 2020, which claims the benefit under 35 U.S.C. § 119 of Korean Patent Application No. 10-209-0109577, filed on Sep. 4, 2019, in the Korean Intellectual Property Office, the disclosures of which are incorporated by reference herein in their entirety.

TECHNICAL FIELD

Exemplary embodiments of the present disclosure relate to a display device and a method of manufacturing the same.

DISCUSSION OF RELATED ART

A display device is an apparatus visually displaying data. Recently, applications of the display device have become more diversified. Also, as the display devices become thinner and lighter, their range of use has been greatly extended.

To protect a display area from external moisture and impurities, the display area of the display device may be encapsulated with an encapsulation member. Recently, as the demand for slim and flexible display devices increases, a thin-film encapsulation layer including a flexible organic insulating layer and/or a flexible inorganic insulating layer instead of metal or glass has been used as the encapsulation member. However, during a subsequent process after a process of forming the thin-film encapsulation layer as the encapsulation member, a defect may occur in which the thin-film encapsulation layer is exfoliated from a back plane of the display device.

SUMMARY

Exemplary embodiments of the present disclosure include a display device and a method of manufacturing the same, in which a defect that a thin-film encapsulation layer is exfoliated from a back plane of the display device is reduced. However, it should be understood that the exemplary embodiments described herein should be considered in a descriptive sense only and not for limitation of the present disclosure.

Additional aspects will be set forth in part in the description which follows and, in part, will be apparent from the description, or may be learned by practice of the exemplary embodiments of the present disclosure.

According to an exemplary embodiment of the present disclosure, a display device includes a display area located over a substrate, the display area including a plurality of pixels of which each includes a first electrode, a second electrode, and an intermediate layer including an emission layer and arranged between the first electrode and the second electrode, a pixel-defining layer covering edges of the first electrode of each of the plurality of pixels, a first spacer arranged on the pixel-defining layer and including a first portion and a second portion, the first portion of the first spacer having a width increasing toward the substrate, and the second portion of the first spacer being arranged between the first portion of the first spacer and the substrate and having a width decreasing toward the substrate, and a first hole arranged apart from the first electrode between the plurality of pixels, the first hole being formed in the second portion of the first spacer and the pixel-defining layer.

The intermediate layer and the second electrode may be located inside the first hole.

The emission layer may be located on the first electrode and may not be located inside the first hole.

The display device may further include a thin-film encapsulation layer encapsulating the plurality of pixels, in which the thin-film encapsulation layer may include a first inorganic encapsulation layer, a second inorganic encapsulation layer, and an organic encapsulation layer located between the first inorganic encapsulation layer and the second inorganic encapsulation layer, the first inorganic encapsulation layer may cover the second electrode located inside the first hole and an entire inner surface of the first hole, and the organic encapsulation layer may fill an entire inner portion of the first hole.

The pixel-defining layer may include a material the same as that of the first spacer.

The display device may further include a first planarization layer and a second planarization layer sequentially arranged from the substrate between the substrate and the pixel-defining layer, and the first hole may extend into the second planarization layer.

The display device may further include a first etching prevention layer arranged under a bottom surface of the first hole.

The display device may further include a thin film transistor located between the substrate and the first planarization layer, and a connection line located between the first planarization layer and the second planarization layer and configured to connect the thin film transistor to the first electrode, in which the first etching prevention layer may include a material the same as that of the connection line.

A first non-display area may be located outside the display area, the pixel-defining layer may extend from the display area to the first non-display area, and the display device may further include a second spacer arranged on the pixel-defining layer of the first non-display area, including a material the same as that of the first spacer, and including a first portion and a second portion, the first portion of the second spacer having a width increasing toward the substrate, and the second portion of the second spacer being arranged between the first portion of the second spacer and the substrate and having a width decreasing toward the substrate, and a second hole located in the first non-display area, the second hole being formed in the second portion of the second spacer and the pixel-defining layer.

The intermediate layer and the second electrode may extend to the first non-display area and may be located inside the second hole.

The first inorganic encapsulation layer, the organic encapsulation layer, and the second inorganic encapsulation layer may extend to the first non-display area, the first inorganic encapsulation layer may cover the second electrode located inside the second hole and an entire inner surface of the second hole, and the organic encapsulation layer may fill an entire inner portion of the second hole.

The display device may further include a power voltage line located in the first non-display area, the power voltage line surrounding a portion of the display area, in which the second electrode extending to the first non-display area may be electrically connected to the power voltage line.

The display device may further include a first dam portion and a second dam portion each located in the first non-display area, in which the first dam portion and the second dam portion may each include a layer including a material the same as that of the second spacer and the pixel-defining layer, and the second dam portion may clad an end portion of the power voltage line.

The display device may further include a first planarization layer and a second planarization layer sequentially arranged from the substrate in the first non-display area between the substrate and the pixel-defining layer, in which the second hole may extend into the second planarization layer.

The display device may further include a second etching prevention layer arranged under a bottom surface of the second hole.

A second non-display area may surround an opening formed inside the display area, and the display device in the second non-display area may further include a base layer including a material the same as that of the pixel-defining layer of the display area, a third spacer located on the base layer, including a material the same as that of the first spacer, and including a first portion and a second portion, the first portion of the third spacer having a width increasing toward the substrate, and the second portion of the third spacer being arranged between the first portion of the third spacer and the substrate and having a width decreasing toward the substrate, and a third hole located in the second non-display area, the third hole being formed in the second portion of the third spacer and the base layer.

The display device may further include a groove passing through a portion of the substrate in the second non-display area.

The intermediate layer and the second electrode may extend to the second non-display area and may be located inside the third hole and the groove.

The first inorganic encapsulation layer, the organic encapsulation layer, and the second inorganic encapsulation layer may extend to the second non-display area, and the first inorganic encapsulation layer and the second inorganic encapsulation layer may cover the second electrode located inside the third hole and the groove, and an entire inner surface of the third hole and the groove.

According to an exemplary embodiment of the present disclosure, a display device includes a display area located over a substrate and including a plurality of pixels, each of the plurality of pixels including a first electrode, a second electrode, and an intermediate layer including an emission layer and located between the first electrode and the second electrode, a non-display area located over the substrate and located outside the display area, a thin-film encapsulation layer encapsulating the plurality of pixels and including a first inorganic encapsulation layer, a second inorganic encapsulation layer, and an organic encapsulation layer located between the first inorganic encapsulation layer and the second inorganic encapsulation layer, a pixel-defining layer covering edges of the first electrode and extending from the display area to the non-display area, a first spacer located on the pixel-defining layer in the display area, a second spacer located on the pixel-defining layer in the non-display area, including a material the same as that of the first spacer, and including a first portion and a second portion, the first portion of the second spacer having a width increasing toward the substrate, and the second portion of the second spacer being arranged between the first portion of the second spacer and the substrate and having a width decreasing toward the substrate, and a hole located in the non-display area, the hole being formed in the second portion of the second spacer and the pixel-defining layer.

A portion of the intermediate layer that excludes the emission layer formed in the display area, and the second electrode may extend to the non-display area and may be located inside the hole, the first inorganic encapsulation layer may extend to the non-display area to cover the second electrode located inside the hole and an entire inner surface of the hole, and the organic encapsulation layer may fill an entire inner portion of the hole.

The first inorganic encapsulation layer, the organic encapsulation layer, and the second inorganic encapsulation layer may extend to the non-display area, the first inorganic encapsulation layer may cover the second electrode located inside the hole and the entire inner surface of the hole, and the organic encapsulation layer may fill the entire inner portion of the hole.

The display device may further include a first planarization layer and a second planarization layer sequentially arranged from the substrate in the non-display area between the substrate and the pixel-defining layer, in which the hole may extend into the second planarization layer.

The display device may further include an etching prevention layer arranged under a bottom surface of the hole.

According to an exemplary embodiment of the present disclosure, a display device includes a display area located over a substrate and including a plurality of pixels, each of the plurality of pixels including a first electrode, a second electrode, and an intermediate layer including an emission layer and located between the first electrode and the second electrode, a pixel-defining layer covering edges of the first electrode, a first spacer located on the pixel-defining layer in the display area, a thin-film encapsulation layer arranged on the pixel-defining layer and the first spacer and including a first inorganic encapsulation layer, a second inorganic encapsulation layer, and an organic encapsulation layer located between the first inorganic encapsulation layer and the second inorganic encapsulation layer, a non-display area surrounding an opening formed inside the display area, a base layer located in the non-display area and including a material the same as that of the pixel-defining layer, a second spacer located on the base layer, including a material the same as that of the first spacer, and including a first portion and a second portion, the first portion of the second spacer having a width increasing toward the substrate, and the second portion of the second spacer being arranged between the first portion of the second spacer and the substrate and having a width decreasing toward the substrate, and a hole located in the non-display area, the hole being formed in the second portion of the second spacer and the base layer.

The display device may further include a groove passing through a portion of the substrate in the non-display area.

The intermediate layer and the second electrode may extend to the non-display area and may be located inside the hole and the groove.

The first inorganic encapsulation layer, the organic encapsulation layer, and the second inorganic encapsulation layer may extend to the non-display area, and the first inorganic encapsulation layer and the second inorganic encapsulation layer may cover the second electrode located inside the hole and the groove, and an entire inner surface of the hole and the groove.

According to an exemplary embodiment of the present disclosure, a method of manufacturing a display device including a display area including a plurality of pixels, and a thin-film encapsulation layer encapsulating the display area, each of the plurality of pixels including a first electrode, a second electrode, and an intermediate layer including an emission layer and located between the first electrode and the second electrode, the method includes forming a pixel-defining layer and a first spacer over a substrate, the pixel-defining layer covering edges of the first electrode, and the first spacer being on the pixel-defining layer, forming a barrier layer to cover the pixel-defining layer and the first spacer, and exposing a partial surface of the pixel-defining layer and the first spacer by patterning the barrier layer, forming a first hole in the pixel-defining layer and the first spacer that are exposed, the first hole being apart from the first electrode, removing the barrier layer, forming the intermediate layer and the second electrode inside and outside the first hole such that the intermediate layer and the second electrode are disconnected inside and outside the first hole, forming a first inorganic encapsulation layer of the thin-film encapsulation layer inside and outside the first hole such that the first inorganic encapsulation layer is connected inside and outside the first hole, and forming an organic encapsulation layer of the thin-film encapsulation layer such that the organic encapsulation layer fills an inside of the first hole.

The pixel-defining layer may include a material the same as that of the first spacer, and the pixel-defining layer and the first spacer may be formed during a same process.

The method may further include forming, between the substrate and the pixel-defining layer, a first planarization layer and a second planarization layer sequentially arranged from the substrate, forming a first etching prevention layer on the first planarization layer, and extending the first hole into the second planarization layer and to the first etching prevention layer.

The method may further include extending the pixel-defining layer to a first non-display area outside the display area, forming a second spacer on the pixel-defining layer in the first non-display area, the second spacer including a material the same as that of the first spacer, covering the pixel-defining layer in the first non-display area and the second spacer with the barrier layer, and exposing a partial surface of the pixel-defining layer and the second spacer by patterning the barrier layer, forming a second hole in the pixel-defining layer and the second spacer that are exposed, removing the barrier layer, forming the intermediate layer and the second electrode inside and outside the second hole such that the intermediate layer and the second electrode are disconnected inside and outside the second hole, forming the first inorganic encapsulation layer inside and outside the second hole such that the first inorganic encapsulation layer is connected inside and outside the second hole without disconnection, and forming the organic encapsulation layer such that the organic encapsulation layer fills an inside of the second hole.

The pixel-defining layer in the first non-display area may include a material the same as that of the second spacer, and the pixel-defining layer in the first non-display area and the second spacer may be formed during a same process.

The method may further include forming, between the substrate and the pixel-defining layer in the first non-display area, a first planarization layer and a second planarization layer sequentially arranged from the substrate, forming a second etching prevention layer on the first planarization layer, and extending the second hole into the second planarization layer and to the second etching prevention layer.

The method may further include forming a base layer in a second non-display area surrounding an opening formed inside the display area, the base layer including a material the same as that of the pixel-defining layer, forming a third spacer on the base layer, the third spacer including the same material as that of the first spacer, covering the base layer and the third spacer with the barrier layer, and exposing a partial surface of the base layer and the third spacer by patterning the barrier layer, forming a third hole in the base layer and the third spacer that are exposed, removing the barrier layer, forming the intermediate layer and the second electrode inside and outside the third hole such that the intermediate layer and the second electrode are disconnected inside and outside the third hole, and forming the first inorganic encapsulation layer and the second inorganic encapsulation layer inside and outside the third hole such that the first inorganic encapsulation layer and the second inorganic encapsulation layer are connected inside and outside the third hole without disconnection.

The base layer may include a material the same as that of the third spacer, and the base layer and the third spacer may be formed during a same process.

The method may further include forming a groove passing through a portion of the substrate while forming the third hole.

The method may further include forming the intermediate layer and the second electrode inside and outside the groove such that the intermediate layer and the second electrode are disconnected inside and outside the groove, and forming the first inorganic encapsulation layer and the second inorganic encapsulation layer inside and outside the groove such that the first inorganic encapsulation layer and the second inorganic encapsulation layer are connected inside and outside the groove without disconnection.

According to an exemplary embodiment of the present disclosure, a display device includes a display area located over a substrate, the display area including a plurality of pixels of which each includes a first electrode, a second electrode, and an intermediate layer including an emission layer and arranged between the first electrode and the second electrode, a pixel-defining layer covering edges of the first electrode of each of the plurality of pixels, a first spacer arranged on the pixel-defining layer and including a first portion and a second portion, and the second portion of the first spacer being arranged between the first portion of the first spacer and the substrate, and a first hole arranged apart from the first electrode in the display area, the first hole being formed in the second portion of the first spacer and the pixel-defining layer, wherein the first hole has a first upper end and a second upper end, a first height of the first end from the substrate being different from a second height of the second end from the substrate.

The first portion of the first spacer may have a width increasing toward the substrate and the second portion of the first spacer has a width decreasing toward the substrate.

The first height may be the same as a height of a top surface of the pixel-defining layer from the substrate and the second height is the same as a height of the top surface of the second portion of the first spacer from the substrate.

The first height may be greater than the second height.

BRIEF DESCRIPTION OF THE DRAWINGS

The above and other aspects and features of the present disclosure will be more apparent from the following description taken in conjunction with the accompanying drawings, in which.

Figure 1:
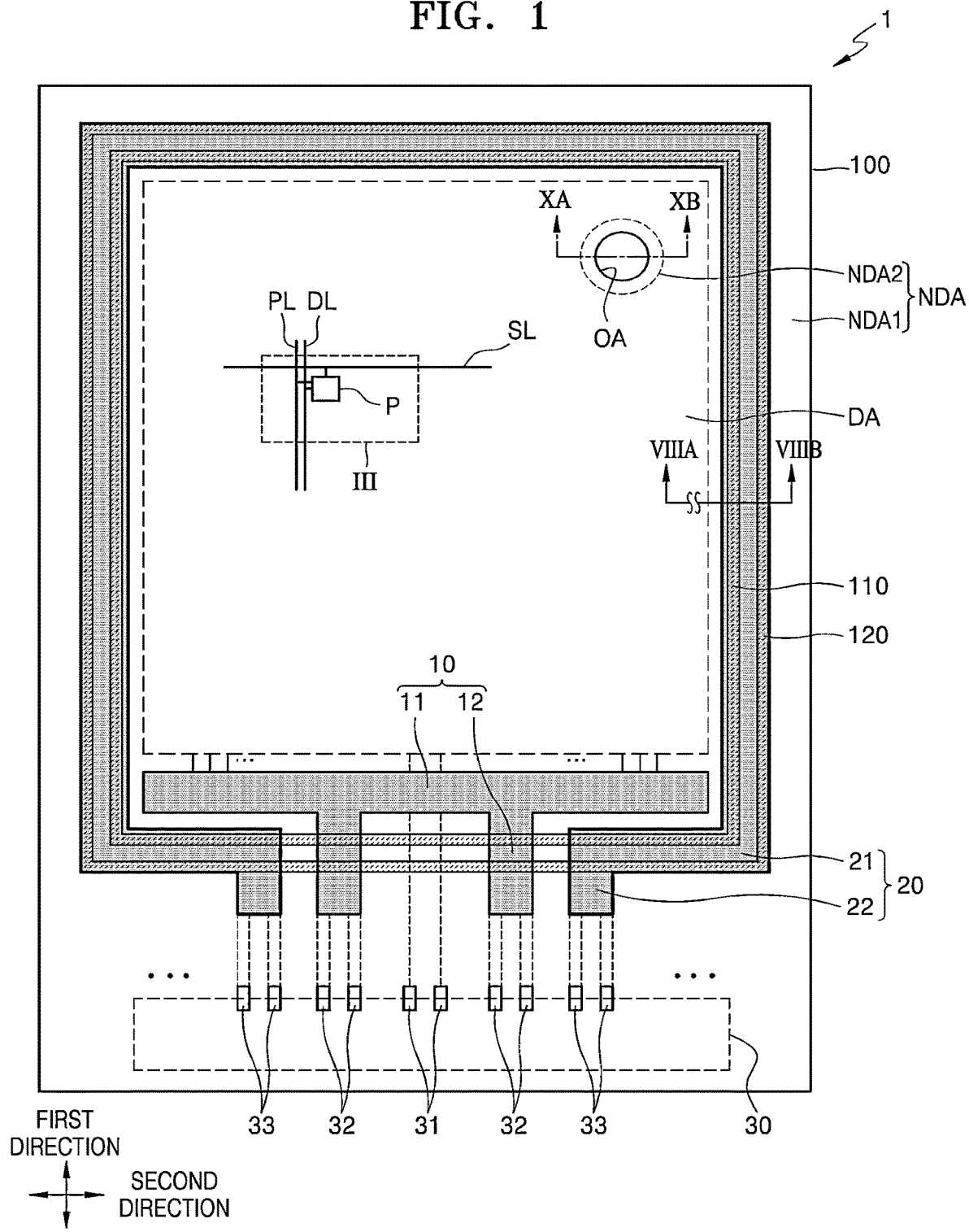
FIG. 1 is a plan view of a display device according to an exemplary embodiment of the present disclosure.

Since the drawings in FIGS. 1-14F are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Reference will now be made in detail to exemplary embodiments of the present disclosure, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present disclosure. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. In the present specification, the expression "at least one of a and b" indicates only a, only b, both a and b, or variations thereof.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

When a certain exemplary embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component and/or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component and/or may be "indirectly electrically connected" to the other layer, region, or component with other layer, region, or component interposed therebetween.

A display device according to an exemplary embodiment of the present disclosure is an apparatus displaying an image and may be various ones, for example, a liquid crystal display, an electrophoretic display, an organic light-emitting display, an inorganic light-emitting display, a field emission display, a surface-conduction electron-emitter display, a plasma display, and a cathode ray display.

Hereinafter, although the display device according to an exemplary embodiment of the present disclosure is described as an organic light-emitting display device as an example, a display device according to the present disclosure is not limited thereto and may be various ones.

Figure 2A:
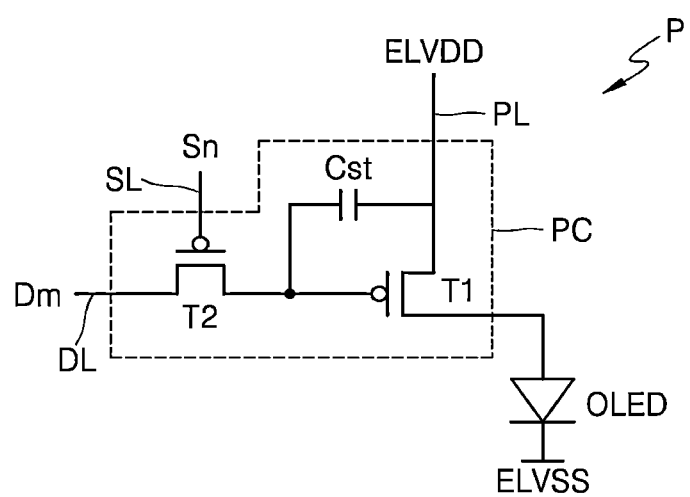
FIGS. 2A and 2B are equivalent circuit diagrams of examples of one pixel included in a display device according to an exemplary embodiment of the present disclosure.
Figure 2B:
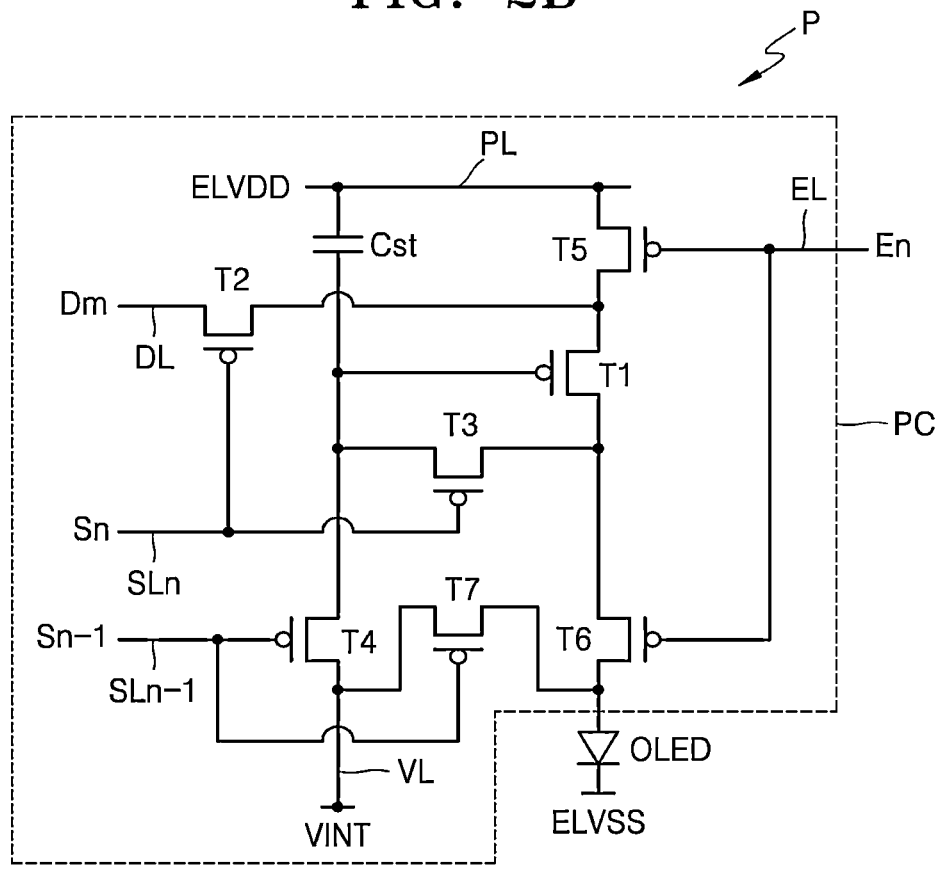
Figure 3:
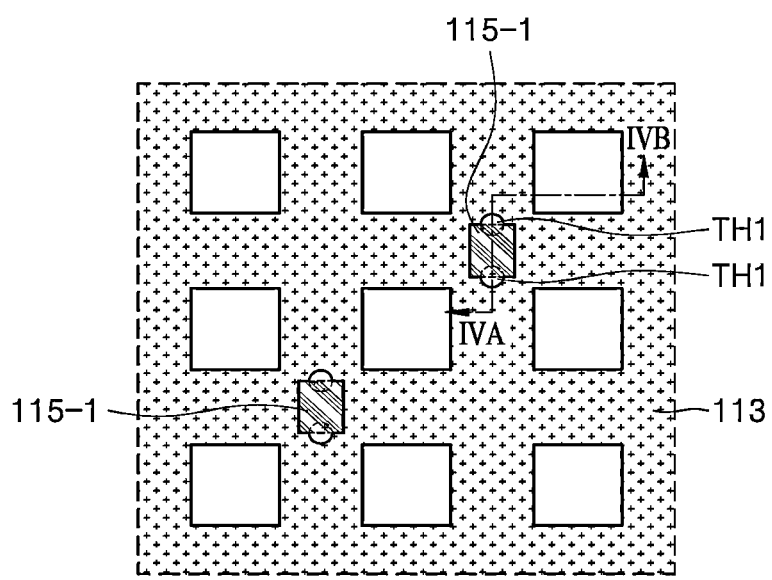
FIG. 3 is a plan view of region III of FIG. 1.
Figure 4:
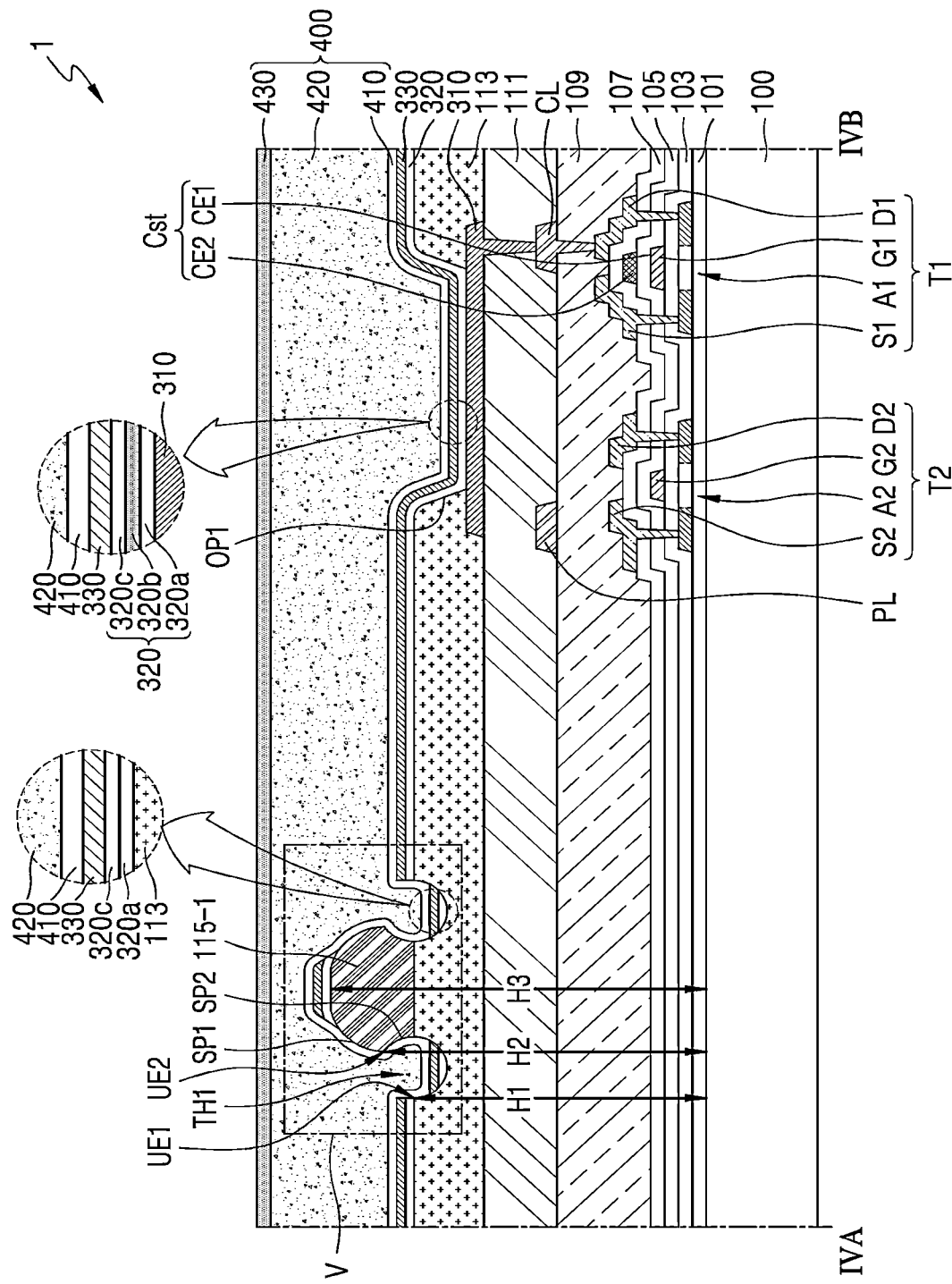
FIG. 4 is a cross-sectional view of the display device taken along line IVA-IVB of FIG. 3.

FIG. 1 is a plan view of a display device 1 according to an exemplary embodiment of the present disclosure, FIGS. 2A and 2B are equivalent circuit diagrams of examples of one pixel included in the display device 1 according to an exemplary embodiment of the present disclosure, FIG. 3 is a plan view of region III of FIG. 1, and FIG. 4 is a cross-sectional view of the display device 1 taken along line IVA-IVB of FIG. 3.

Referring to FIG. 1, the display device 1 includes a display area DA arranged over a substrate 100. The display area DA includes pixels P connected to a data line DL and a scan line SL, with the data line DL extending in a first direction, and the scan line SL extending in a second direction intersecting with the first direction. Each pixel P may be connected to a driving voltage line PL extending in the first direction. In an exemplary embodiment of the present disclosure, a plurality of pixels may be arranged in a matrix shape, but the present disclosure is not limited thereto. For example, the plurality of pixels may be arranged in a pentile matrix shape, or a diamond shape.

One pixel P may emit, for example, red, green, blue, or white light and may include, for example, an organic light-emitting diode. Also, each pixel P may further include an element such as a thin film transistor and a capacitor. The display area DA may provide a predetermined image using light emitted from the pixels P. For example, in the display area DA, a plurality of pixels, for example, an array of pixels, may be arranged, and the predetermined image may be displayed via the array of pixels.

The display device 1 may include a non-display area NDA in which the pixels P emitting light are not arranged. The non-display area NDA may include a first non-display area NDA1 and a second non-display area NDA2, with the first non-display area NDA1 being arranged outside the display area DA and surrounding the display area DA, and the second non-display area NDA2 surrounding an opening area OA that is at least partially surrounded by the display area DA. For example, as shown in FIG. 1, the second non-display area NDA2 and the opening area OA are entirely surrounded by the display area DA. However, the present disclosure is not limited thereto. For example, in an exemplary embodiment of the present disclosure, a portion of the opening area OA is not surrounded by the display area DA.

A first power voltage line 10 and a second power voltage line 20 may be arranged in the first non-display area NDA1, with the second power voltage line 20 providing a voltage different from a voltage of the first power voltage line 10.

The first power voltage line 10 may include a first main voltage line 11 and a first connection line 12 each arranged on one side of the display area DA. For example, in the case where the display area DA is a rectangle, the first main voltage line 11 may be arranged to correspond to one of the sides of the display area DA. The first connection line 12 may extend in the first direction from the first main voltage line 11, and may be connected to a first terminal 32 of a terminal unit 30.

The second power voltage line 20 may include a second main voltage line 21 and a second connection line 22, with the second main voltage line 21 surrounding two opposite end portions of the first main voltage line 11 and partially surrounding the display area DA, and the second connection line 22 extending in the first direction from the second main voltage line 21. For example, in the case where the display area DA is a rectangle, the second main voltage line 21 may extend along the two opposite end portions of the first main voltage line 11 and the rest of the sides of the display area DA excluding one side of the display area DA that neighbors the first main voltage line 11. The second connection line 22 extends in the first direction in parallel to the first connection line 12 and is connected to a second terminal 33 of the terminal unit 30. The second power voltage line 20 may be bent to surround the end portions of the first power voltage line 10.

The terminal unit 30 is arranged on one end portion of the substrate 100 and includes the plurality of terminals, that is, the first, second, and third terminals 32, 33, and 31. The terminal unit 30 may be exposed and electrically connected to a controller such as a flexible printed circuit board (FPCB) or a driving driver integrated circuit (IC) chip by not being covered by an insulating layer. In an exemplary embodiment of the present disclosure, the FPCB may be electrically connected to the terminal unit 30 located at a side of the display device 1 in the first non-display area NDA1. The FPCB may be bent and electrically connected to the display device 1. Accordingly, the FPCB functioning as the controller may output a signal to the display device 1 or receive a signal from the display device 1 through the terminal unit 30.

The controller may be configured to convert a plurality of image signals transferred from the outside to a plurality of image data signals and transfer the plurality of image data signals to the display area DA through the third terminal 31. Also, the controller may be configured to receive a vertical synchronization signal, a horizontal synchronization signal, and a clock signal, generate control signals for controlling an operation of first and second gate drivers, and transfer the generated control signals to the first and second gate drivers through terminals. Each of the control signals generated by the controller may include a vertical start signal for controlling the operation of the first and second gate drivers and at least one clock signal for determining the output timing of signals.

The controller may be configured to respectively transfer different voltages to the first power voltage line 10 and the second power voltage line 20 through the first terminal 32 and the second terminal 33.

The first power voltage line 10 may provide a first power voltage ELVDD (see FIGS. 2A and 2B) to each pixel P, and the second power voltage line 20 may provide a second power voltage ELVSS (see FIGS. 2A and 2B) to each pixel P.

The first power voltage ELVDD may be provided to each pixel P through the driving voltage line PL connected to the first power voltage line 10. The second power voltage ELVSS may be provided to a cathode of an organic light-emitting diode OLED (see FIGS. 2A and 2B) provided to each pixel P. In this case, the second main voltage line 21 of the second power voltage line 20 may be connected to the cathode of the organic light-emitting diode OLED in the first non-display area NDA1.

A scan driver, a data driver, etc. may be further arranged in the first non-display area NDA1, with the scan driver providing a scan signal to a scan line SL of each pixel, and the data driver providing a data signal to a data line DL of each pixel. The data driver may be located on one edge of the substrate 100, or may be located on the FPCB electrically connected to the terminal unit 30 located at a side of the display device 1 in the first non-display area NDA1.

A first dam portion 110 may be apart from a second dam portion 120 in the first non-display area NDA1, with the first and second dam portions 110 and 120 each surrounding the display area DA.

The first and second dam portions 110 and 120 may serve as dams blocking an organic material flowing in an edge direction of the substrate 100 while forming, by using an inkjet process, an organic encapsulation layer 420 (see FIGS. 4 and 8) including the organic material such as a monomer constituting a thin-film encapsulation layer 400 (see FIG. 4). Therefore, the first and second dam portions 110 and 120 may prevent an edge tail by the organic encapsulation layer 420 from being formed at an edge of the substrate 100 (see FIG. 8). As shown in FIG. 1, the first and second dam portions 110 and 120 may surround the display area DA.

Referring to FIG. 2A, each pixel P includes a pixel circuit PC and the organic light-emitting diode OLED connected to the pixel circuit PC, with the pixel circuit PC being connected to the scan line SL and the data line DL. Each of the pixels P may emit, for example, red light, green light, or blue light, or may emit red light, green light, blue light, or white light, via the organic light-emitting diode OLED.

The pixel circuit PC includes a driving thin film transistor T1, a switching thin film transistor T2, and a storage capacitor Cst. The switching thin film transistor T2 for controlling turn-on and turn-off of the pixel P is configured to transfer a data signal Dm input through the data line DL to the driving thin film transistor T1 in response to a scan signal Sn input through the scan line SL.

The storage capacitor Cst is connected to the switching thin film transistor T2 and the driving voltage line PL and may be configured to store a voltage corresponding to a difference between a voltage transferred from the switching thin film transistor T2 and the first power voltage ELVDD (or a driving voltage) supplied to the driving voltage line PL.

The driving thin film transistor T1 is connected to the driving voltage line PL and the storage capacitor Cst and may be configured to control a driving current flowing through the organic light-emitting diode OLED from the driving voltage line PL, in response to the voltage stored in the storage capacitor Cst. The organic light-emitting diode OLED may be configured to emit light having a predetermined brightness according to the driving current. The turn-on time of the driving thin film transistor T1 may be determined according to the amount of voltage stored in the storage capacitor Cst. The driving thin film transistor T1 may then provide to the organic light-emitting diode OLED the first power voltage ELVDD transmitted through the driving voltage line PL during the turn-on time.

Although it is shown in FIG. 2A that the pixel circuit PC includes two thin film transistors and one storage capacitor, the present disclosure is not limited thereto. For example, the pixel circuit PC may include three, four, five, six, seven, or more transistors instead of the above two transistors. Also, more than one storage capacitors may be included in the pixel circuit PC.

Referring to FIG. 2B, the pixel circuit PC may include a driving thin film transistor T1, a switching thin film transistor T2, a compensation thin film transistor T3, a first initialization thin film transistor T4, a first emission control thin film transistor T5, a second emission control thin film transistor T6, and a second initialization thin film transistor T7.

Although it is shown in FIG. 2B that each pixel P includes signal lines SLn, SLn-1, EL, and DL, an initialization voltage line VL, and the driving voltage line PL, the present disclosure is not limited thereto. For example, in an exemplary embodiment of the present disclosure, at least one of the signal lines SLn, SLn-1, EL, or DL, and/or the initialization voltage line VL may be shared by pixels that neighbor each other.

A drain electrode of the driving thin film transistor T1 may be electrically connected to the anode of the organic light-emitting diode OLED through the second emission control thin film transistor T6. The driving thin film transistor T1 is configured to receive a data signal Dm depending on a switching operation of the switching thin film transistor T2, and to supply the driving current to the organic light-emitting diode OLED.

A gate electrode of the switching thin film transistor T2 is connected to the first scan line SLn, and a source electrode of the switching thin film transistor T2 is connected to the data line DL. A drain electrode of the switching thin film transistor T2 may be connected to a source electrode of the driving thin film transistor T1 and simultaneously connected to the driving voltage line PL through the first emission control thin film transistor T5.

The switching thin film transistor T2 is turned on in response to a first scan signal Sn transferred through the scan line SLn and is configured to perform a switching operation of transferring a data signal Dm transferred through the data line DL to the source electrode of the driving thin film transistor T1.

A gate electrode of the compensation thin film transistor T3 may be connected to the first scan line SLn. A source electrode of the compensation thin film transistor T3 may be connected to a drain electrode of the driving thin film transistor T1 and simultaneously connected to a pixel electrode of the organic light-emitting diode OLED through the second emission control thin film transistor T6. A drain electrode of the compensation thin film transistor T3 may be connected to one of the electrodes of the storage capacitor Cst, a source electrode of the first initialization thin film transistor T4, and the gate electrode of the driving thin film transistor T1, simultaneously. The compensation thin film transistor T3 is turned on in response to a first scan signal Sn transferred through the first scan line SL and is configured to diode-connect the driving thin film transistor T1 by connecting the gate electrode of the driving thin film transistor T1 to the drain electrode of the driving thin film transistor T1.

A gate electrode of the first initialization thin film transistor T4 may be connected to a second scan line SLn-1 (also referred to as a previous scan line). A drain electrode of the first initialization thin film transistor T4 may be connected to the initialization voltage line VL. A source electrode of the first initialization thin film transistor T4 may be connected to one of the electrodes of the storage capacitor Cst, the drain electrode of the compensation thin film transistor T3, and the gate electrode of the driving thin film transistor T1, simultaneously. The first initialization thin film transistor T4 may be turned on in response to a second scan signal Sn-1 transferred through the second scan line SLn-1 and is configured to transfer an initialization voltage VINT to the gate electrode of the driving thin film transistor T1, thereby performing an initialization operation of initializing a voltage of the gate electrode of the driving thin film transistor T1.

A gate electrode of the first emission control thin film transistor T5 may be connected to the emission control line EL. A source electrode of the first emission control thin film transistor T5 may be connected to the driving voltage line PL. A drain electrode of the first emission control thin film transistor T5 is connected to the source electrode of the driving thin film transistor T1 and the drain electrode of the switching thin film transistor T2.

A gate electrode of the second emission control thin film transistor T6 may be connected to the emission control line EL. A source electrode of the second emission control thin film transistor T6 may be connected to the drain electrode of the driving thin film transistor T1 and the source electrode of the compensation thin film transistor T3. A drain electrode of the second emission control thin film transistor T6 may be electrically connected to the pixel electrode of the organic light-emitting diode OLED. The first emission control thin film transistor T5 and the second emission control thin film transistor T6 are simultaneously turned on in response to an emission control signal En received through the emission control line EL, the first power voltage ELVDD is transferred to the organic light-emitting diode OLED, and the driving current flows through the organic light-emitting diode OLED.

A gate electrode of the second initialization thin film transistor T7 may be connected to the second scan line SLn-1. A source electrode of the second initialization thin film transistor T7 may be connected to the pixel electrode of the organic light-emitting diode OLED. A drain electrode of the second initialization thin film transistor T7 may be connected to the initialization voltage line VL. The second initialization thin film transistor T7 may be turned on in response to a second scan signal Sn-1 transferred through the second scan line SLn-1 to initialize the pixel electrode of the organic light-emitting diode OLED.

Although it is shown in FIG. 2B that the first initialization thin film transistor T4 and the second initialization thin film transistor T7 are connected to the second scan line SLn-1, the present disclosure is not limited thereto. For example, in an exemplary embodiment of the present disclosure, the first initialization thin film transistor T4 may be connected to the second scan line SLn-1, which is the previous scan line, and driven in response to a second scan signal Sn-1, and the second initialization thin film transistor T7 may be connected to a separate signal line (for example, the next scan line) and driven in response to a signal transferred through the separate signal line.

One of the electrodes of the storage capacitor Cst may be simultaneously connected to the gate electrode of the driving thin film transistor T1, the drain electrode of the compensation thin film transistor T3, and the source electrode of the first initialization thin film transistor T4. The other electrode of the storage capacitor Cst may be connected to the driving voltage line PL. In an exemplary embodiment of the present disclosure, an additional capacitor may be formed to cause the potential on the gate electrode of the driving thin film transistor T1 to increase to a predetermined level by the voltage of the scan signal Sn. One end of the additional capacitor may be connected to the first scan line SLn, and the other end of the additional capacitor may be connected to the drain electrode of the compensation thin film transistor T3 and the gate electrode of the driving thin film transistor T1.

An opposite electrode (e.g., a cathode) of the organic light-emitting diode OLED is configured to receive the second power voltage ELVSS (or a common power voltage). The organic light-emitting diode OLED receives the driving current from the driving thin film transistor T1, and emits light to display an image.

The pixel circuit PC is not limited to the number of thin film transistors, the number of capacitors, and the circuit design described with reference to FIGS. 2A and 2B. The number of thin film transistors, the number of capacitors, and the circuit design may be variously changed.

Referring to FIG. 3, a plurality of pixels P are arranged in region III of FIG. 1. The plurality of pixels P are surrounded by a pixel-defining layer 113, and a first spacer 115-1 is arranged on the pixel-defining layer 113. A plurality of first holes TH1 are arranged between the pixels P, with the plurality of first holes TH1 passing through an insulating layer.

Although it is shown in FIG. 3 that the pixels P have a quadrangular shape of a same size, this is provided as an example, and the present disclosure is not limited thereto. For example, the size, the shape, and the arrangement of the pixels P may be changed.

The first spacer 115-1 may be arranged between some pixels P among the plurality of pixels P. During a process of depositing an intermediate layer 320 (see FIG. 4) including an emission layer by using a mask, the first spacer 115-1 maintains a separation between the mask and the substrate 100 to prevent the intermediate layer 320 from being chopped or torn by the mask during the deposition process.

The first spacer 115-1 may include a material the same as that of the pixel-defining layer 113. While the pixel-defining layer 113 is formed by using a half-tone mask, the first spacer 115-1 may be simultaneously formed with the pixel-defining layer 113 at a height different from the height of the pixel-defining layer 113 by using a material the same as that of the pixel-defining layer 113.

The first hole TH1 may be arranged between some pixels P among the plurality of pixels P, and may include a predetermined opening space passing through a portion of the first spacer 115-1 and a portion of the pixel-defining layer 113 to fix the thin-film encapsulation layer 400 described below to a back plane. The back plane may be a structure of the display device 1 right before the thin-film encapsulation layer 400 is formed. For example, the first hole TH1 may serve as an anchor and thus may increase contact strength between the thin-film encapsulation layer 400 and the back plane.

Referring to FIG. 4, a buffer layer 101 is arranged on the substrate 100. The driving thin film transistor T1, the switching thin film transistor T2, and the storage capacitor Cst are arranged on the buffer layer 101.

The substrate 100 may include various materials such as, for example, glass, metal, or plastic. For example, the substrate 100 may include a flexible substrate including a polymer resin such as, for example, polyethersulfone (PES), polyacrylate (PAR), polyetherimide (PEI), polyethylene naphthalate (PEN), polyethylene terephthalate (PET), polyphenylene sulfide (PPS), polyarylate (PAr), polyimide (PI), polycarbonate (PC), or cellulose acetate propionate (CAP).

The buffer layer 101 may be provided on the substrate 100, and may include an inorganic insulating (insulative) material such as, for example, silicon oxide ($SiO_x$), silicon oxynitride (SiON), and/or silicon nitride ($SiN_x$), and may be formed to prevent the penetration of impurities. The buffer layer 101 may be a single layer or multiple layers including the inorganic insulating material.

The driving thin film transistor T1 includes a driving semiconductor layer A1 and a driving gate electrode G1, and the switching thin film transistor T2 includes a switching semiconductor layer A2 and a switching gate electrode G2. A first gate insulating layer 103 is arranged between the driving semiconductor layer A1 and the driving gate electrode G1 and between the switching semiconductor layer A2 and the switching gate electrode G2. The first gate insulating layer 103 may include an inorganic insulating material such as, for example, silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), lanthanum oxide ($La_2O_3$), zirconium oxide ($ZrO_2$), hafnium oxide ($HfO_2$), etc. The first gate insulating layer 103 may be a single layer or a multi-layer including the aforementioned materials.

The driving semiconductor layer A1 and the switching semiconductor layer A2 may include amorphous silicon (a-Si) or polycrystalline silicon (p-Si). In an exemplary embodiment of the present disclosure, the driving semiconductor layer A1 and the switching semiconductor layer A2 may include an oxide of at least one of, for example, indium (In), gallium (Ga), tin (Sn), zirconium (Zr), vanadium (V), hafnium (Hf), cadmium (Cd), germanium (Ge), chromium (Cr), titanium (Ti), or zinc (Zn).

The driving semiconductor layer A1 may include a driving channel region, a driving source region, and a driving drain region, with the driving channel region overlapping the driving gate electrode G1 and not doped with impurities, and the driving source region and the driving drain region being on two opposite sides of the driving channel region and doped with impurities. For example, the driving source region and the driving drain region may be doped with an n-type dopant or a p-type dopant. A driving source electrode S1 and a driving drain electrode D1 may be respectively connected to the driving source region and the driving drain region.

The switching semiconductor layer A2 may include a switching channel region, a switching source region, and a switching drain region, with the switching channel region overlapping the switching gate electrode G2 and not doped with impurities, and the switching source region and the switching drain region being on two opposite sides of the switching channel region and doped with impurities. For example, the switching source region and the switching drain region may be doped with an n-type dopant or a p-type dopant. A switching source electrode S2 and a switching drain electrode D2 may be respectively connected to the switching source region and the switching drain region.

The driving source electrode S1, the driving drain electrode D1, the switching source electrode S2 and the switching drain electrode D2 may each include a highly conductive material. Each of the driving source electrode S1, the driving drain electrode D1, the switching source electrode S2 and the switching drain electrode D2 may include a conductive material including, for example, silver (Ag), molybdenum (Mo), aluminum (Al), copper (Cu), chromium (Cr), nickel (Ni), titanium (Ti), an alloy thereof, etc., and may be a multi-layer or a single layer including the aforementioned materials. In an exemplary embodiment of the present disclosure, each of the driving source electrode S1, the driving drain electrode D1, the switching source electrode S2 and the switching drain electrode D2 may be formed as a multi-layer of titanium/aluminum/titanium (Ti/Al/Ti).

The driving gate electrode G1 and the switching gate electrode G2 may each include a single layer or a multi-layer including at least one of, for example, silver (Ag), molybdenum (Mo), aluminum (Al), copper (Cu), chromium (Cr), nickel (Ni), titanium (Ti), or an alloy thereof.

In an exemplary embodiment of the present disclosure, the storage capacitor Cst may overlap the driving thin film transistor T1. In this case, the areas of the storage capacitor Cst and the driving thin film transistor T1 may be increased and a high-quality image may be provided. For example, the driving gate electrode G1 may serve as a first storage capacitor plate CE1 of the storage capacitor Cst. A second storage capacitor plate CE2 of the storage capacitor Cst may overlap the first storage capacitor plate CE1 with a second gate insulating layer 105 interposed therebetween. The second gate insulating layer 105 may include an inorganic insulating material such as, for example, silicon oxide ($SiO_x$), silicon nitride ($SiN_x$), and/or silicon oxynitride (SiON). The upper electrode CE2 of the storage capacitor Cst may include a conductive material including, for example, silver (Ag), molybdenum (Mo), aluminum (Al), copper (Cu), chromium (Cr), nickel (Ni), titanium (Ti), an alloy thereof, etc., and may be a multi-layer or a single layer including the aforementioned materials.

The driving thin film transistor T1, the switching thin film transistor T2, and the storage capacitor Cst may be covered by an interlayer insulating layer 107.

The interlayer insulating layer 107 may include an inorganic material such as, for example, silicon oxide ($SiO_x$), silicon nitride ($SiN_x$), and/or silicon oxynitride (SiON).

A data line DL is arranged on the interlayer insulating layer 107. The data line DL is connected to the switching semiconductor layer A2 of the switching thin film transistor T2 through a contact hole passing through the interlayer insulating layer 107. The data line DL may serve as the switching source electrode S2.

The driving source electrode S1, the driving drain electrode D1, the switching source electrode S2, and the switching drain electrode D2 may be arranged on the interlayer insulating layer 107 and may be connected to the driving semiconductor layer A1 or the switching semiconductor layer A2 through contact holes passing through the interlayer insulating layer 107.

The data line DL, the driving source electrode S1, the driving drain electrode D1, the switching source electrode S2, and the switching drain electrode D2 may be covered by an inorganic protective layer.

The inorganic protective layer may include a single layer or a multi-layer including at least one of silicon oxide ($SiO_x$) and silicon nitride ($SiN_x$). The inorganic protective layer may prevent some wirings exposed in the first non-display area NDA1, for example, wirings simultaneously formed during a process the same as a process of forming the data line DL, from being damaged by etchant used while the pixel electrode 310 is patterned.

The driving voltage line PL may be arranged on a layer different from a layer on which the data line DL is arranged. In the present specification, when A and B are referred to as being arranged on different layers, at least one insulating layer is arranged between A and B, one of A and B is arranged below the at least one insulating layer, and the other of A and B is arranged over the at least one insulating layer. A first planarization layer 109 may be arranged between the driving voltage line PL and the data line DL, and the driving voltage line PL may be covered by a second planarization layer 111.

The driving voltage line PL may include a single layer or a multi-layer including at least one of, for example, aluminum (Al), copper (Cu), titanium (Ti), or an alloy thereof. In an exemplary embodiment of the present disclosure, the driving voltage line PL may include a triple layer of titanium/aluminum/titanium (Ti/Al/Ti).

Although FIG. 4 shows a configuration in which the driving voltage line PL is arranged on the first planarization layer 109, the present disclosure is not limited thereto. For example, in an exemplary embodiment of the present disclosure, the driving voltage line PL may be connected to a lower additional voltage line through a through hole formed in the first planarization layer 109 to reduce a resistance, with the lower additional voltage line being arranged on a layer the same as a layer on which the data line DL is arranged.

Each of the first planarization layer 109 and the second planarization layer 111 may include a single layer or a multi-layer.

The first planarization layer 109 and the second planarization layer 111 may include an organic insulating material. For example, the organic insulating material may include a general-purpose polymer such as polymethylmethacrylate (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

The first planarization layer 109 and the second planarization layer 111 may include an inorganic insulating material. For example, the inorganic insulating material may include, for example, silicon oxide ($SiO_x$), silicon nitride ($SiN_x$), and/or silicon oxynitride (SiON).

The organic light-emitting diode OLED may be located on the second planarization layer 111, and may include the pixel electrode 310, an opposite electrode 330, and the intermediate layer 320 interposed therebetween, with the intermediate layer 320 including an emission layer 320b.

The pixel electrode 310 is connected to a connection line CL formed on the first planarization layer 109, and the connection line CL is connected to the driving drain electrode D1 of the driving thin film transistor T1. The connection line CL may include a conductive material including, for example, molybdenum (Mo), aluminum (Al), copper (Cu), titanium (Ti), an alloy thereof, etc., and may be formed as a multi-layer or a single layer including the aforementioned materials. The connection line CL may include a material the same as that included in the driving source electrode S1, the driving drain electrode D1, the switching source electrode S2 and the switching drain electrode D2.

For example, the connection line CL may be formed as a multi-layer of titanium/aluminum/titanium (Ti/Al/Ti).

The pixel electrode 310 may include a transparent electrode or a reflective electrode.

In the case where the pixel electrode 310 includes a transparent electrode, the pixel electrode 310 may include a transparent conductive layer. The transparent conductive layer may include at least one of, for example. indium tin oxide (ITO), indium zinc oxide (IZO), zinc oxide (ZnO), indium oxide ($In_2O_3$), indium gallium oxide (IGO), or aluminum zinc oxide (AZO). In this case, the pixel electrode 310 may further include a semi-transmissive layer to improve a light efficiency in addition to the transparent conductive layer, with the semi-transmissive layer including a thin film ranging from several micrometers to tens of micrometers and including at least one of, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or ytterbium (Yb).

In the case where the pixel electrode 310 includes a reflective electrode, the pixel electrode 310 may include a reflective layer and a transparent conductive layer on and/or under the reflective layer, with the reflective layer including at least one of, for example, silver (Ag), magnesium (Mg), aluminum (Al), platinum (Pt), palladium (Pd), gold (Au), nickel (Ni), neodymium (Nd), iridium (Ir), chromium (Cr), or a compound thereof. The transparent conductive layer may include at least one of, for example, indium tin oxide (ITO), indium zinc oxide (IZO), zinc oxide (ZnO), indium oxide ($In_2O_3$), indium gallium oxide (IGO), or aluminum zinc oxide (AZO). However, the present disclosure is not limited thereto, and the pixel electrode 310 may include various materials and have various structures including a single layer and/or a multi-layer.

The pixel-defining layer 113 may be arranged on the pixel electrode 310.

The pixel-defining layer 113 defines a pixel P by including a first opening OP1 exposing the pixel electrode 310, and may cover an edge of the pixel electrode 310. Also, the pixel-defining layer 113 may prevent an arc from occurring at end portions of the pixel electrode 310 by increasing a distance between edges of the pixel electrode 310 and the opposite electrode 330. The pixel-defining layer 113 may include an organic material such as, for example, polyimide (PI) or hexamethyldisiloxane (HMDSO).

The intermediate layer 320 includes the emission layer 320b. The intermediate layer 320 may include a first functional layer 320a and/or a second functional layer 320c, with the first functional layer 320a being arranged under the emission layer 320b, and the second functional layer 320c being arranged on the emission layer 320b. The emission layer 320b may include a polymer organic material or a low molecular weight organic material each emitting light having a predetermined color. In an exemplary embodiment of the present disclosure, the emission layer 320b may include at least one of materials emitting red, green, or blue light, and may include a fluorescent material or a phosphorescent material.

The first functional layer 320a may include a single layer or a multi-layer. For example, in the case the first functional layer 320a includes a polymer material, the first functional layer 320a is a hole transport layer (HTL), which has a single-layered structure, and may include poly(3,4-ethylenedioxythiophene) (PEDOT) or polyaniline (PANI). In the case where the first functional layer 320a includes a low molecular weight material, the first functional layer 320a may include a hole injection layer (HIL) and a hole transport layer (HTL).

The second functional layer 320c may be omitted. For example, in the case where the first functional layer 320a and the emission layer 320b include a polymer material, the second functional layer 320c may be formed. The second functional layer 320c may include a single layer or a multi-layer. The second functional layer 320c may include an electron transport layer (ETL) and/or an electron injection layer (EIL). For example, the intermediate layer 320 may include at least one of a hole transport layer (HTL), a hole injection layer (HIL), an electron injection layer (EIL), or an electron transport layer (ETL).

The emission layer 320b of the intermediate layer 320 may be arranged for each pixel P in the display area DA. The emission layer 320b may be formed on a portion of the pixel electrode 310 that is exposed through the opening of the pixel-defining layer 113. The emission layer 320b may be arranged to overlap the first opening OP1 of the pixel-defining layer 113 and/or the pixel electrode 310. The first and second functional layers 320a and 320c of the intermediate layer 320 may be formed as an integral layer that is common to the plurality of pixel electrodes 310, and accordingly may be formed not only in the display area DA but also in the first non-display area NDA1, while the emission layer 320b is formed only in the display area DA. The intermediate layer 320 may be formed by various methods such as vacuum deposition.

The opposite electrode 330 may be arranged in the display area DA and may cover the display area DA. That is, the opposite electrode 330 may be formed as one body over the plurality of organic light-emitting diodes OLED to correspond to the plurality of pixel electrodes 310. The opposite electrode 330 is electrically connected to the second power voltage line 20 described below.

The opposite electrode 330 may include a transparent electrode or a reflective electrode. In the case where the opposite electrode 330 includes a transparent electrode, the opposite electrode 330 may include at least one of, for example, silver (Ag), aluminum (Al), magnesium (Mg), lithium (Li), calcium (Ca), copper (Cu), lithium fluoride/calcium (LiF/Ca), lithium fluoride/aluminum (LiF/Al), magnesium-silver (MgAg), or calcium-silver (CaAg), and may include a thin film having a thickness ranging from several micrometers to tens of micrometers. Alternatively, the opposite electrode 330 may include a thin film having a thickness ranging from several nanometers to hundreds of nanometers.

In the case where the opposite electrode 330 includes a reflective electrode, the opposite electrode 330 may include at least one of, for example, silver (Ag), aluminum (Al), magnesium (Mg), lithium (Li), calcium (Ca), copper (Cu), lithium fluoride/calcium (LiF/Ca), lithium fluoride/aluminum (LiF/Al), magnesium-silver (MgAg), or calcium-silver (CaAg). However, the composition and the material of the opposite electrode 330 are not limited thereto and may be variously changed. The opposite electrode 330 may be formed not only in the display area DA but also in the first non-display area NDA1.

The first spacer 115-1 is arranged on the pixel-defining layer 113, and protrudes in a direction from the pixel-defining layer 113 to the thin-film encapsulation layer 400. During a process of depositing the intermediate layer 320 including the emission layer 320b by using a mask, the first spacer 115-1 maintains a separation between the mask and the substrate 100 to prevent the intermediate layer 320 from being chopped or torn by the mask during the deposition process.

The first spacer 115-1 may include an organic material such as, for example, polyimide (PI) or hexamethyldisiloxane (HMDSO). For example, the first spacer 115-1 may include a material the same as that of the pixel-defining layer 113. The first spacer 115-1 may be arranged on at least one of the first and second dam portions 110 and 120 described below, may be used for preventing moisture transmission, and may form a step difference of the dam portions.

Since the organic light-emitting diode OLED may be easily damaged by external moisture or oxygen, the organic light-emitting diode OLED may be covered and protected by the thin-film encapsulation layer 400.

The thin-film encapsulation layer 400 may cover the display area DA and extend outside the display area DA. For example, the thin-film encapsulation layer 400 may encapsulate the display area DA. Since the display area DA includes a plurality of pixels, the thin-film encapsulation layer 400 may encapsulate the plurality of pixels. The thin-film encapsulation layer 400 may include at least one organic encapsulation layer and at least one inorganic encapsulation layer. In an exemplary embodiment of the present disclosure, the thin-film encapsulation layer 400 may include a first inorganic encapsulation layer 410, an organic encapsulation layer 420, and a second inorganic encapsulation layer 430.

The first inorganic encapsulation layer 410 may entirely cover the opposite electrode 330, and may include, for example, silicon oxide ($SiO_x$), silicon nitride ($SiN_x$), and/or silicon oxynitride (SiON).

When needed, other layers such as a capping layer may be arranged between the first inorganic encapsulation layer 410 and the opposite electrode 330. For example, to enhance a light efficiency, the capping layer may include at least one organic material or inorganic material selected from among silicon oxide ($SiO_2$), silicon nitride ($SiN_x$), zinc oxide ($ZnO_2$), titanium oxide ($TiO_2$), zirconium oxide ($ZrO_2$), indium tin oxide (ITO), indium zinc oxide (IZO), tris-(8-hydroxyquinoline) aluminum ($Alq_3$), copper(II) phthalocyanine (CuPc), (4,4'-N,N'-dicarbazole) biphenyl (CBP), and N,N'-di-[(1-naphthyl)-N,N'-diphenyl]-1,1'-biphenyl)-4,4'-diamine (α-NPB). In an exemplary embodiment of the present disclosure, the capping layer may allow plasmon resonance to occur with respect to light generated by the organic light-emitting diode OLED. For example, the capping layer may include nano particles. The capping layer may prevent the organic light-emitting diode OLED from being damaged by heat, plasma, etc. occurring during a chemical vapor deposition (CVD) process or a sputtering process for forming the thin-film encapsulation layer 400. For example, the capping layer may include an epoxy-based material including at least one of, for example, a bisphenol-type epoxy resin, an epoxidized butadiene resin, a fluorine-type epoxy resin, or a novolac epoxy resin. The capping layer may have an area larger than that of the opposite electrode 330 such that an end of the opposite electrode 330 is covered, thereby preventing oxidation of the opposite electrode 330 during the chemical vapor deposition (CVD) process or the sputtering process of forming the thin-film encapsulation layer 400.

When needed, a layer including lithium fluoride (LiF), etc. may be arranged between the first inorganic encapsulation layer 410 and the capping layer.

Since the first inorganic encapsulation layer 410 is formed along a structure thereunder, a top surface of the first inorganic encapsulation layer 410 is not flat. For example, the first inorganic encapsulation layer 410 may be conformally formed on the structure thereunder. The organic encapsulation layer 420 covers the first inorganic encapsulation layer 410, and may be planarized. For example, the organic encapsulation layer 420 may be formed on the first inorganic encapsulation layer 410 by a spin coating process. A top surface of the organic encapsulation layer 420 corresponding to the display area DA may be approximately flat.

The organic encapsulation layer 420 may include, for example, polyethylene terephthalate (PET), polyethylene naphthalate (PEN), polycarbonate (PC), polyimide (PI), polyethylene sulfonate (PES), polyoxymethylene (POM), polyarylate (PAr), hexamethyldisiloxane (HMDSO), an acrylic resin (e.g., polymethylmethacrylate (PMMA), a polyacrylic acid (PAA), etc.), or an arbitrary combination thereof.

The second inorganic encapsulation layer 430 may cover the organic encapsulation layer 420, and may include, for example, silicon oxide ($SiO_x$), silicon nitride ($SiN_x$), and/or silicon oxynitride (SiON). Since the second inorganic encapsulation layer 430 is deposited to directly contact the first inorganic encapsulation layer 410 in an edge area of the display device 1, the second inorganic encapsulation layer 430 may seal the organic encapsulation layer 420 such that the organic encapsulation layer 420 is not exposed to the outside. Accordingly, external moisture or oxygen may be prevented or reduced from being infiltrated into the display area DA through the organic encapsulation layer 420.

During a subsequent process after the thin-film encapsulation layer 400 is formed, for example, a process of removing a protective film that has been stuck on the thin-film encapsulation layer 400 before forming a touch sensor layer on the thin-film encapsulation layer 400 or attaching a polarization film on the thin-film encapsulation layer 400, a defect may occur in which the thin-film encapsulation layer 400 may be exfoliated from a back plane of the display device 1. The back plane may be a structure of the display device 1 right before the thin-film encapsulation layer 400 is formed. For example, in the case where the opposite electrode 330 is formed right before the thin-film encapsulation layer 400 is formed, an exfoliation defect may occur between the thin-film encapsulation layer 400 and the display device 1 including the opposite electrode 330. For example, in the case where the capping layer is formed between the thin-film encapsulation layer 400 and the opposite electrode 330 right before the thin-film encapsulation layer 400 is formed, an exfoliation defect may occur between the thin-film encapsulation layer 400 and the display device 1 including the capping layer. For example, in the case where a layer including LiF is formed on the capping layer and the first inorganic encapsulation layer 410, an exfoliation defect may occur between the thin-film encapsulation layer 400 and the display device 1 including the layer including LiF. In addition, in the case where another functional layer is further added between the opposite electrode 330 and the thin-film encapsulation layer 400 right before the thin-film encapsulation layer 400 is formed, the display device 1 including the organic light-emitting diode OLED and the functional layer may be understood as the back plane.

To reduce an exfoliation defect of the thin-film encapsulation layer 400, the present exemplary embodiment may increase contact strength between the thin-film encapsulation layer 400 and the back plane by forming the plurality of first holes TH1 serving as anchors for the thin-film encapsulation layer 400 between the plurality of pixels in the display area DA. For example, the plurality of first holes TH1 may reinforce adhesive force between the thin-film encapsulation layer 400 and the back plane, thereby reducing an exfoliation defect of the thin-film encapsulation layer 400.

The first hole TH1 is formed to pass through a portion of the first spacer 115-1 and a portion of the pixel-defining layer 113, and may have a predetermined opening space, with the first hole TH1 being arranged in a location apart from the pixel electrode 310.

The first hole TH1 may have a first upper end UE1 and a second upper end UE2 having different heights from the substrate 100. A first height H1 from the substrate 100 to the first upper end UE1 of the first hole TH1 is the same as a height from the substrate 100 to the top surface of the pixel-defining layer 113, and a second height H2 from the substrate 100 to the second upper end UE2 of the first hole TH1 is the same as a height from the substrate 100 to the upper surface of the second portion SP2 of the first spacer 115-1. That is, the second height H2 is greater than the first height H1.

In a virtual boundary surface located between the first portion SP1 and the second portion SP2 of the first spacer 115-1, the bottom surface of the first portion SP1 of the first spacer 115-1 may coincide with the top surface of the second portion SP2 of the first spacer 115-1. On the other hand, because the first portion SP1 of the first spacer 115-1 is located above the second portion SP2, a third height H3, which is the height from the substrate 100 to the upper surface of the first portion SP1, is higher than the second height H2.

Figure 5:
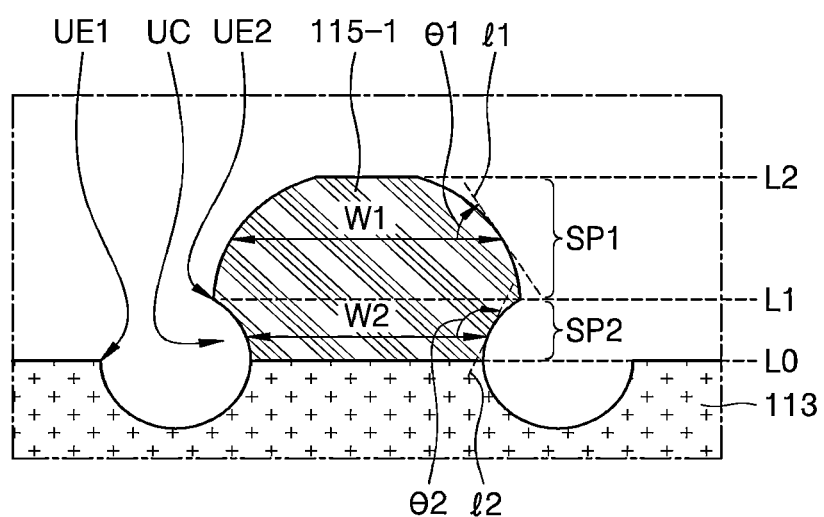
FIG. 5 is a cross-sectional view of shapes of a pixel-defining layer and a first spacer corresponding to region V of FIG. 4.

Referring to FIG. 5, which is a cross-sectional view of the shapes of region V of the pixel-defining layer 113 in which the first hole TH1 is formed and the first spacer 115-1 in FIG. 4, the first hole TH1 is formed to have an undercut shape UC in a first portion SP1 of the first spacer 115-1 and the pixel-defining layer 113.

The first spacer 115-1 may include the first portion SP1 and a second portion SP2, with the first portion SP1 having a width that increases toward the substrate 100 from a direction away from the substrate 100, and the second portion SP2 being arranged between the first portion SP1 and the substrate 100 and having a width that is reduced toward the substrate 100. For example, a first width W1 of the first spacer 115-1 at an arbitrary point of the first portion SP1 in a direction parallel to the substrate 100 increases from a point L2 to a point L1, with the point L2 being farthest away from the substrate 100, and the point L1 being closer to the substrate 100 than the point L2. A second width W2 of the first spacer 115-1 at an arbitrary point of the second portion SP2 in the direction parallel to the substrate 100 may be reduced from the point L1 to a point L0. As shown in FIG. 5, the point L0 may be at the lowest level of the first spacer 115-1, the point L2 may be at the highest level of the first spacer 115-1, and the point L1 may be at a level where the first portion SP1 and the second portion SP2 meet, for example, at the interface between the first portion SP1 and the second portion SP2. Alternatively, a tangential line ƒ1 at an arbitrary point (e.g., a point chosen at the right surface of the the first spacer 115-1) of the first portion SP1 on a surface of the first spacer 115-1 may form an acute angle θ1 in a clockwise direction with respect to a virtual line parallel to the substrate 100. A tangential line ƒ2 at an arbitrary point (e.g., a point chosen at the right surface of the the first spacer 115-1) of the second portion SP2 on a surface of the first spacer 115-1 may form an obtuse angle θ2 in the clockwise direction with respect to a virtual line parallel to the substrate 100. That is, the first portion SP1, which is a top region of the first spacer 115-1, may be a forward-tapered shape, and the second portion SP2, which is a bottom region of the first spacer 115-1, may be an inverse-tapered shape.

When the top region of the first spacer 115-1 is formed as an inverse-tapered shape, a contact area between a mask and the first spacer 115-1 increases during a process of depositing the intermediate layer 320 including the emission layer 320b by using the mask, the number of particles generated by the mask may increase. In contrast, according to the present exemplary embodiment, since the top region of the first spacer 115-1 is formed as a forward-tapered shape, the number of particles generated by the mask may be reduced.

Since the second portion SP2, which is the bottom region of the first spacer 115-1, is formed as an inverse-tapered shape, the second portion SP2 constitutes the first hole TH1 in cooperation with a portion of the pixel-defining layer 113, with the first hole TH1 constituting a predetermined opening space.

Referring to FIG. 4 again, the intermediate layer 320 and the opposite electrode 330 may be formed on a bottom surface of the first hole TH1. The deposition of the intermediate layer 320 and the opposite electrode 330 on the bottom surface of the first hole TH1 may be non-conformal.

The first functional layer 320a and the second functional layer 320c of the intermediate layer 320 may be formed inside the first hole TH1, and the emission layer 320b of the intermediate layer 320 may not be formed inside the first hole TH1. This is because the emission layer 320b may be deposited on only an emission area that is patterned for each pixel through a patterned metal mask, and the first and second functional layers 320a and 320c may be deposited as common layers over all the pixels without being patterned for each pixel. For example, the first and second functional layers 320a and 320c may be formed not only in areas over the pixels but also in areas between the pixels. Like the first and second functional layers 320a and 320c, the opposite electrode 330 may be deposited as a common layer over all the pixels. For example, the opposite electrode 330 may be formed not only in areas over the pixels but also in areas between the pixels.

The first inorganic encapsulation layer 410 of the thin-film encapsulation layer 400 is formed on the opposite electrode 330 inside the first hole TH1. The first inorganic encapsulation layer 410 is formed on not only the bottom surface of the first hole TH1 but also an entire inner surface of the first hole TH1 including the bottom surface of the first hole TH1 above the opposite electrode 330. The deposition of first inorganic encapsulation layer 410 on the bottom surface of the first hole TH1 above the opposite electrode 330 may be conformal.

Although the first inorganic encapsulation layer 410 directly contacts the opposite electrode 330 on the bottom surface inside the first hole TH1, the first inorganic encapsulation layer 410 may directly contact the pixel-defining layer 113 and the first spacer 115-1 on a lateral surface of the first hole TH1. Therefore, contact areas between the first inorganic encapsulation layer 410 and the organic insulating layers increase and thus adhesive force of the thin-film encapsulation layer 400 may be reinforced.

The organic encapsulation layer 420 fills an entire inside of the first hole TH1. Particularly, according to the present exemplary embodiment, since the shape of the opening formed in the first hole TH1 is an undercut shape in which the first portion SP1 further protrudes than the second portion SP2 on an interface between the first portion SP1 and the second portion SP2 of the first spacer 115-1, and the organic encapsulation layer 420 fills the opening having the undercut shape, the first hole TH1 serves as an anchor and thus may increase contact strength between the thin-film encapsulation layer 400 and the back plane.

As described above, the display device according to the present exemplary embodiment may increase contact strength between the thin-film encapsulation layer 400 and the back plane by forming the plurality of first holes TH1 between the plurality of pixels in the display area DA, thereby reducing a defect in which the thin-film encapsulation layer 400 is exfoliated from the back plane. Also, particles generated by a deposition mask may be reduced by forming the top portion of the first spacer 115-1 as a forward-tapered shape, and contact strength between the thin-film encapsulation layer 400 and the back plane may be increased by forming the bottom region of the first spacer 115-1 as an inverse-tapered shape and thus disconnecting the intermediate layer 320 and the common electrode 330 (or the opposite electrode 330) inside and outside the first hole TH1 in which the undercut is formed.

Hereinafter, a manufacturing process of forming the first hole TH1 of FIG. 4 is described with reference to FIGS. 6A to 6F.

FIGS. 6A to 6F are cross-sectional views of a manufacturing process of forming the first hole TH1 in region V of FIG. 4 according to an exemplary embodiment of the present disclosure.

Figure 6A:
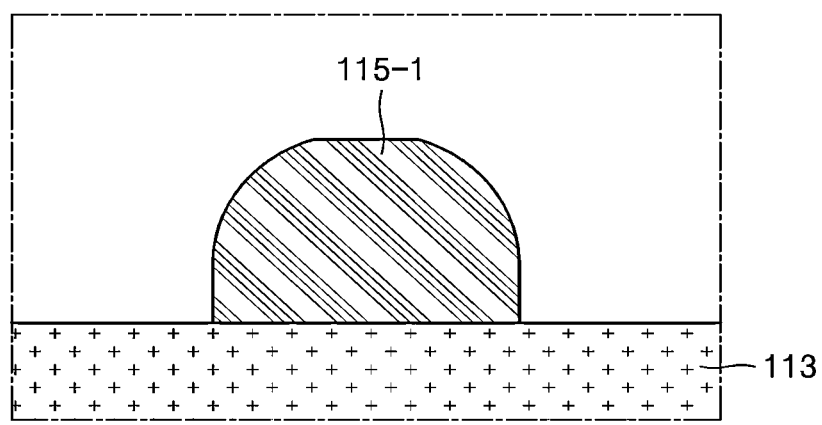
FIGS. 6A to 6F are cross-sectional views of a manufacturing process of forming a first hole in region V of FIG. 4 according to an exemplary embodiment of the present disclosure.

Referring to FIG. 6A, the first spacer 115-1 is located on the pixel-defining layer 113. Although it is shown in FIG. 6A that the pixel-defining layer 113 and the first spacer 115-1 are expressed as different layers with different hatchings, the present disclosure is not limited thereto. For example, the pixel-defining layer 113 and the first spacer 115-1 may include the same material. For example, the pixel-defining layer 113 and the first spacer 115-1 may be simultaneously formed by using a halftone mask during the same process. For example, the pixel-defining layer 113 and the first spacer 115-1 may each include an organic material such as, for example, polyimide (PI) or hexamethyldisiloxane (HMDSO).

Figure 6B:
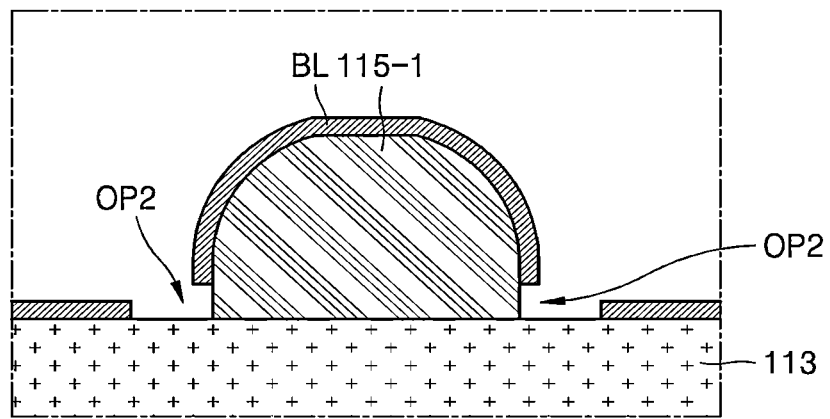

Referring to FIG. 6B, a barrier layer BL is formed on the structure of FIG. 6A by a deposition process, and a second opening OP2 is formed by patterning the barrier layer BL, with the second opening OP2 exposing a portion of the pixel-defining layer 113 and a partial surface of a bottom region of the first spacer 115-1.

Figure 6C:
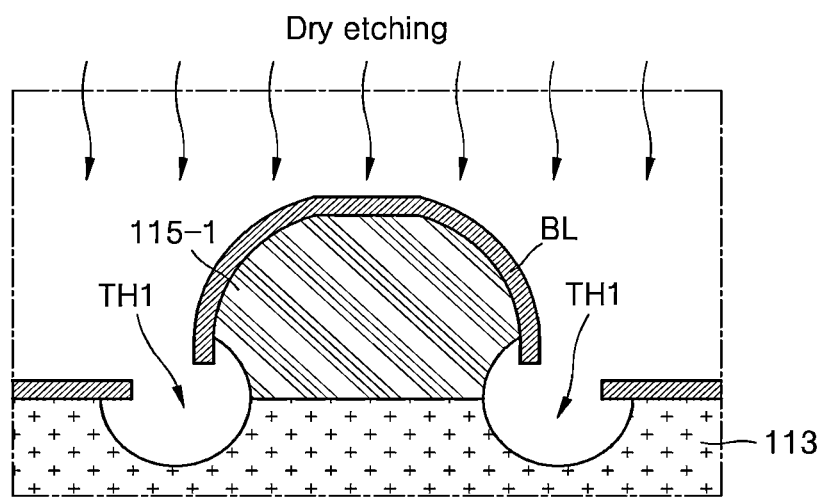

Referring to FIG. 6C, the first hole TH1 is formed by etching a portion of the pixel-defining layer 113 and a portion of the first spacer 115-1 each corresponding to the second opening OP2 using the barrier layer BL as an etch mask. The first hole TH1 may be formed by dry etching.

Figure 6D:
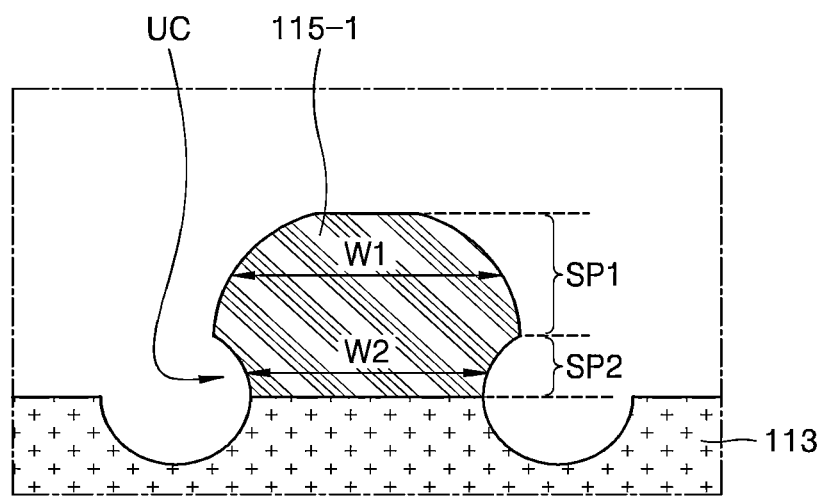

Referring to FIG. 6D, the barrier layer BL is removed by wet etching.

The second portion SP2, which is a region of the first spacer 115-1 that is dry-etched, may have an inverse-tapered shape in which the second width W2 of the first spacer 115-1 is reduced toward the substrate 100, and the first portion SP1, which is a region of the first spacer 115-1 that is not etched, may have a forward-tapered shape in which the first width W1 of the first spacer 115-1 increases toward the substrate 100. Therefore, the first hole TH1 may have the undercut shape UC in which the first portion SP1 further protrudes than the second portion SP2 at an interface between the first portion SP1 and the second portion SP2 of the first spacer 115-1. For example, the undercut shape UC of the first hole TH1 is formed in the first portion SP1 of the first spacer 115-1 and the pixel-defining layer 113 on a side of the first spacer 115-1, with the first hole TH1 passing through a portion of the first spacer 115-1 and a portion of the pixel-defining layer 113.

Figure 6E:
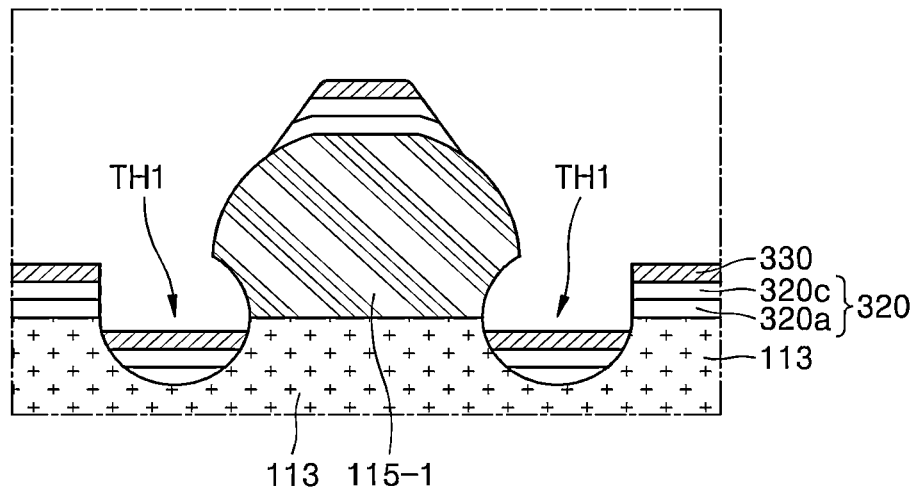

Referring to FIG. 6E, the intermediate layer 320 and the opposite electrode 330 are deposited in the first hole TH1. The intermediate layer 320 and the opposite electrode 330 are formed on the bottom surface of the first hole TH1, a top surface of the pixel-defining layer 113 outside the first hole TH1, and a top surface of the first spacer 115-1. That is, the intermediate layer 320 and the opposite electrode 330 may be disconnected around the undercut UC of the first hole TH1. For example, the intermediate layer 320 and the opposite electrode 330 may be formed inside and outside the first hole TH1, such that the intermediate layer 320 and the opposite electrode 330 are disconnected inside and outside the first hole TH1. The intermediate layer 320 formed in the first hole TH1 may include the first functional layer 320a and the second functional layer 320c and may not include the emission layer 320b.

The intermediate layer 320 and the opposite electrode 330 may be formed by physical vapor deposition (PVD) which has poor step coverage. Thus, the intermediate layer 320 and the opposite electrode 330 may be non-conformally formed on the bottom surface of the first hole TH1, a top surface of the pixel-defining layer 113 outside the first hole TH1, and a top surface of the first spacer 115-1. For example, the intermediate layer 320 and the opposite electrode 330 may be formed by one of, for example, sputtering, thermal evaporation, E-beam evaporation, laser molecular beam epitaxy, or pulsed laser deposition.

Figure 6F:
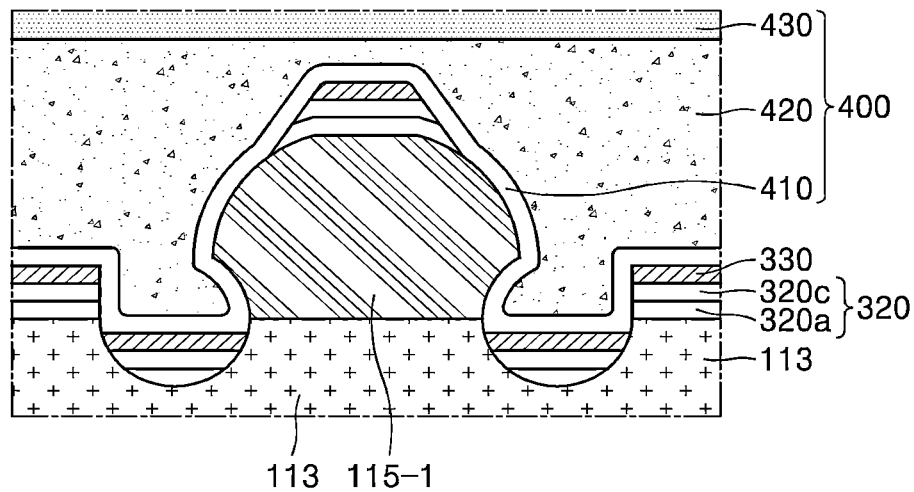

Referring to FIG. 6F, the thin-film encapsulation layer 400 is formed in the first hole TH1, with the thin-film encapsulation layer 400 including the first inorganic encapsulation layer 410, the organic encapsulation layer 420, and the second inorganic encapsulation layer 430.

The first inorganic encapsulation layer 410 is stacked not only on the bottom surface of the first hole TH1 above the opposite electrode 330 inside the first hole TH1 but also over an entire inner surface of the first hole TH1. Also, the first inorganic encapsulation layer 410 is formed on a top surface of the pixel-defining layer 113 outside the first hole TH1 and on a top surface and a lateral surface of the first spacer 115-1. That is, despite the undercut UC, the first inorganic encapsulation layer 410 may be continuously formed inside and outside the first hole TH1 without disconnection.

The first inorganic encapsulation layer 410 may be formed by chemical vapor deposition (CVD) or atomic layer deposition (ALD) having excellent step coverage compared to physical vapor deposition (PVD). Thus, the first inorganic encapsulation layer 410 may be conformally formed on the entire inner surface of the first hole TH1, on a top surface of the opposite electrode 330 outside the first hole TH1, and on a top surface and a lateral surface of the first spacer 115-1. For example, the first inorganic encapsulation layer 410 may be formed by one of, for example, thermal CVD, plasma CVD, metal-organic (MO) CVD, or hydride vapor phase epitaxy (HVPE).

After the first inorganic encapsulation layer 410 is formed, the organic encapsulation layer 420 is formed. The organic encapsulation layer 420 fills an entire inner portion of the first hole TH1 and may have a planarized top surface. For example, the organic encapsulation layer 420 may be formed on the first inorganic encapsulation layer 410 by a spin coating process. After the organic encapsulation layer 420 is formed, the second inorganic encapsulation layer 430 is formed.

Figure 7:
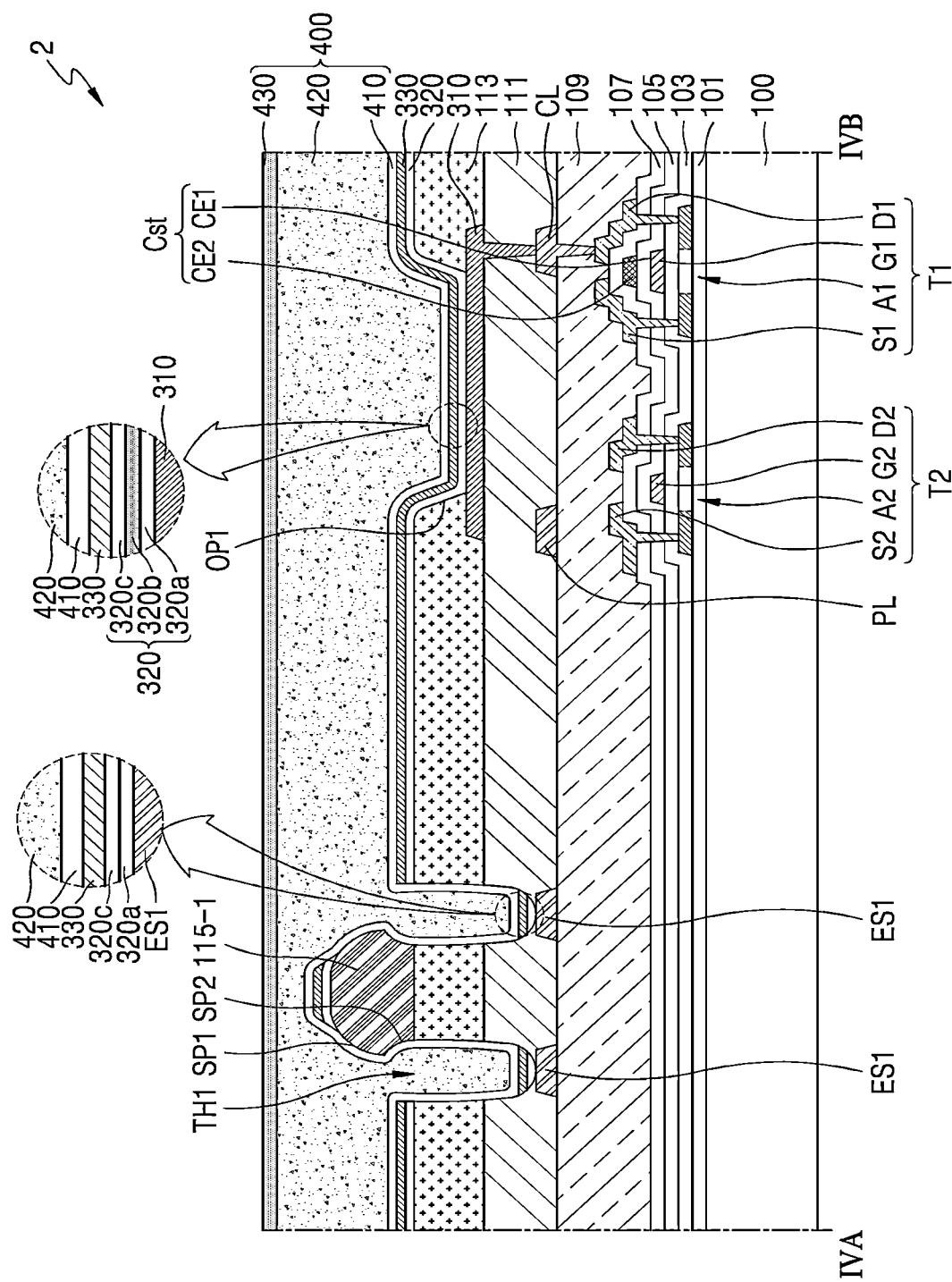
FIG. 7 is a cross-sectional view of a portion of a display device according to an exemplary embodiment of the present disclosure.

FIG. 7 is a cross-sectional view of a portion of a display device 2 according to an exemplary embodiment of the present disclosure. Hereinafter, differences between the exemplary embodiment of FIG. 7 and the exemplary embodiment of FIG. 4 are mainly described.

Referring to FIG. 7, a first etching prevention layer ES1 is located on a portion of the first planarization layer 109 above which the first hole TH1 is formed. For example, the first etching prevention layer ES1 may be arranged under a bottom surface of the first hole TH1. The first hole TH1 is not only formed in the second portion SP2, which is the bottom region of the first spacer 115-1, and the pixel-defining layer 113, but also extends into the second planarization layer 111.

The first etching prevention layer ES1 may be apart from the connection line CL, may include a material the same as that of the connection line CL, and may be formed during a process the same as a process of forming the connection line CL. The first etching prevention layer ES1 may prevent the deterioration of the first planarization layer 109 and various wirings, an electrode, a circuit, etc. of the display device 2 that are arranged thereunder during a process of forming the first hole TH1, for example, while the opening space of the first hole TH1 is formed by dry etching.

In the present exemplary embodiment, the intermediate layer 320 and the opposite electrode 330 are formed on the bottom surface of the first hole TH1, and the intermediate layer 320 may include the first functional layer 320a and the second functional layer 320c and may not include the emission layer 320b. Also, the first inorganic encapsulation layer 410 is not only stacked on the bottom surface of the first hole TH1 above the opposite electrode 330 but also continuously formed on the entire inner surface of the first hole TH1 including the bottom surface of the first hole TH1 and outside the first hole TH1, and the organic encapsulation layer 420 fills the inner portion of the first hole TH1. Therefore, adhesive force of the thin-film encapsulation layer 400 may be reinforced. For example, the plurality of first holes TH1 may serve as anchors for the thin-film encapsulation layer 400 between the plurality of pixels in the display area DA, and may reinforce adhesive force between the thin-film encapsulation layer 400 and the back plane, thereby reducing an exfoliation defect of the thin-film encapsulation layer 400.

Figure 8:
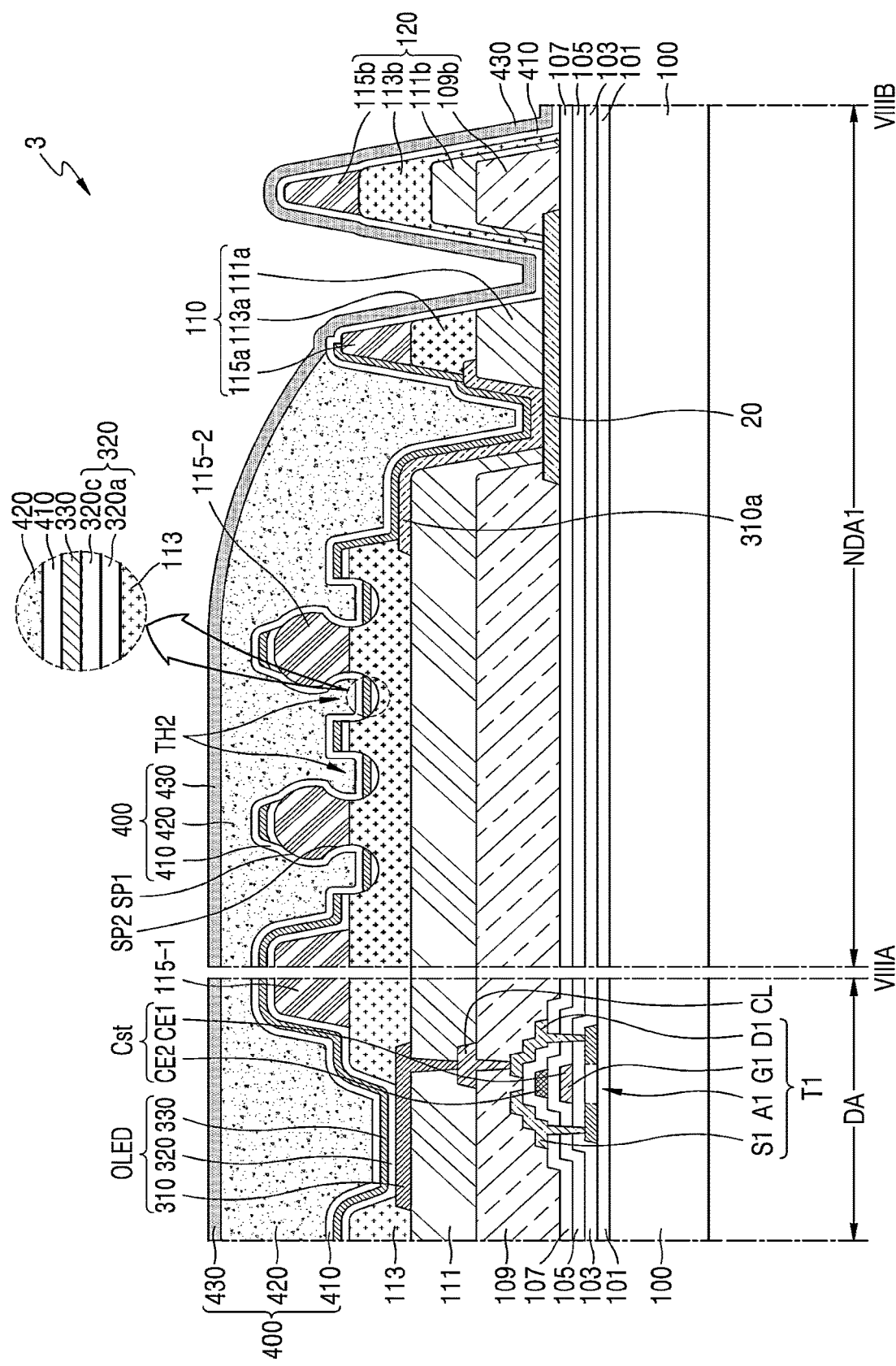
FIG. 8 is a cross-sectional view of a portion of a display device according to an exemplary embodiment of the present disclosure.

FIG. 8 is a cross-sectional view of a portion of a display device 3 according to an exemplary embodiment of the present disclosure. Hereinafter, differences between the exemplary embodiment of FIG. 8 and the exemplary embodiment of FIG. 4 are mainly described. FIG. 8 shows a cross-sectional region taken along line VIIIA-VIIIB of FIG. 1, and a portion of the display area DA.

Referring to FIG. 8, in the present exemplary embodiment, a plurality of second holes TH2 are formed in the first non-display area NDA1, and the first dam portion 110 and the second dam portion 120 are located outside the second hole TH2. The first dam portion 110 may be apart from a second dam portion 120 in the first non-display area NDA1, and each may surround the display area DA. Although, like the exemplary embodiment of FIG. 4, the first holes TH1 may be formed in the display area DA in the present exemplary embodiment, the case where the second holes TH2 are formed in the first non-display area NDA1 is mainly described in the present exemplary embodiment.

The first planarization layer 109, the second planarization layer 111, and the pixel-defining layer 113 each extending from the display area DA are located in the first non-display area NDA1, and a second spacer 115-2 is located in the first non-display area NDA1, with the second spacer 115-2 including a material the same as that of the first spacer 115-1.

The second hole TH2 is formed to pass through a portion of the second spacer 115-2 and a portion of the pixel-defining layer 113, and may have a predetermined opening space. A structure of the second hole TH2 is similar to the structure of the first hole TH1. For example, a first portion SP1, which is a top region of the second spacer 115-2, may be a forward-tapered shape, and a second portion SP2, which is a bottom region of the second spacer 115-2, may be an inverse-tapered shape.

The intermediate layer 320 and the opposite electrode 330 may be formed not only in the display area DA but also in a portion of the first non-display area NDA1 outside the display area DA. That is, the intermediate layer 320 and the opposite electrode 330 may be formed on a bottom surface of the second hole TH2.

The first functional layer 320a and the second functional layer 320c of the intermediate layer 320 may be formed inside the second hole TH2, and the emission layer 320b of the intermediate layer 320 may not be formed inside the second hole TH2. Like the intermediate layer 320, the opposite electrode 330 is formed on the bottom surface of the second hole TH2 and is not formed on a lateral surface of the second hole TH2. For example, the intermediate layer 320 and the opposite electrode 330 may be formed inside and outside the second hole TH2, such that the intermediate layer 320 and the opposite electrode 330 are disconnected inside and outside the second hole TH2. Like the first and second functional layers 320a and 320c, the opposite electrode 330 may be deposited as a common layer over all the pixels. Similar to the first spacer 115-1, during a process of depositing the intermediate layer 320 including the emission layer 320b by using a mask, the second spacer 115-2 may maintain a separation between the mask and the substrate 100 to prevent the intermediate layer 320 from being chopped or torn by the mask during the deposition process.

When viewed from a side parallel to the substrate 100, since the opposite electrode 330 is entirely connected outside the opening in which the second holes TH2 are formed, the opposite electrode 330 extending from the display area DA may be electrically connected to the second power voltage line 20 through a pixel electrode connection line 310a.

The first inorganic encapsulation layer 410 is formed on the opposite electrode 330. The first inorganic encapsulation layer 410 is not only stacked on the bottom surface of the second hole TH2 above the opposite electrode 330 but also formed on the entire inner surface of the second hole TH2 including the bottom surface of the second hole TH2, extends to the outside of the second hole TH2, and extends to the first dam portion 110 and the second dam portion 120.

Although the first inorganic encapsulation layer 410 directly contacts the opposite electrode 330 on the bottom surface inside the second hole TH2, the first inorganic encapsulation layer 410 may directly contact the pixel-defining layer 113 and the second spacer 115-2 on the lateral surface of the second hole TH2. Therefore, contact areas between the first inorganic encapsulation layer 410 and the organic insulating layers increase and thus adhesive force of the thin-film encapsulation layer 400 may be reinforced.

The organic encapsulation layer 420 fills an entire inner portion of the second hole TH2. Since the shape of the opening formed in the second hole TH2 is an undercut shape in which the first portion SP1 further protrudes than the second portion SP2 on an interface between the first portion SP1 and the second portion SP2 of the second spacer 115-2, and the organic encapsulation layer 420 fills the opening having the undercut shape, the second hole TH2 serves as an anchor and thus may increase contact strength between the thin-film encapsulation layer 400 and the back plane. For example, a plurality of second holes TH2 may serve as anchors for the thin-film encapsulation layer 400 in the first non-display area NDA1, and may reinforce adhesive force between the thin-film encapsulation layer 400 and the back plane, thereby reducing an exfoliation defect of the thin-film encapsulation layer 400.

Since the first hole TH1 described in FIG. 4 is provided as a plurality of first holes TH1 in the display area DA, when the first holes TH1 are additionally arranged in the display area DA between the pixels P, space limitation occurs as the resolution is raised. In contrast, since the second holes TH2 according to the present exemplary embodiment are formed in the first non-display area NDA1, a greater number of holes per unit area may be formed with high density without space limitation.

The first dam portion 110 and the second dam portion 120 are arranged at locations overlapping the second power voltage line 20 outside the second hole TH2.

The first dam portion 110 may include a first layer 111a, a second layer 113a, and a third layer 115a, with the first layer 111a including a material the same as that of the second planarization layer 111, the second layer 113a including a material the same as that of the pixel-defining layer 113, and the third layer 115a including a material the same as that of the first spacer 115-1 and the second spacer 115-2. However, the layers constituting the first dam portion 110 are not limited thereto and the number of layers and the material of layers may be changed. For example, in an exemplary embodiment of the present disclosure, the first dam portion 110 may further include an additional layer including a material the same as that of the first planarization layer 109 to form a four-layered structure.

A portion of the first dam portion 110 may overlap the opposite electrode 330 extending from the display area DA. Since an end portion of the opposite electrode 330 extends to the second power voltage line 20, a noise that may influence a touch sensor layer may be blocked, with the touch sensor layer being formed on the thin-film encapsulation layer 400.

The second dam portion 120 may include a first layer 109b, a second layer 111b, a third layer 113b, and a fourth layer 115b, with the first layer 109b including a material the same as that of the first planarization layer 109, the second layer 111b including a material the same as that of the second planarization layer 111, and the third layer 113b including a material the same as that of the pixel-defining layer 113, and the fourth layer 115b including a material the same as that of the first spacer 115-1 and the second spacer 115-2. However, the layers constituting the second dam portion 120 are not limited thereto and the number of layers and the material of layers may be changed.

The first and second dam portions 110 and 120 may serve as dams blocking an organic material flowing in an edge direction of the substrate 100 while forming the organic encapsulation layer 420 including the organic material (see FIG. 8). The second dam portion 120 may be higher than the first dam portion 110. Since a height of the second dam portion 120 is higher than a height of the first dam portion 110, the organic encapsulation layer 420 may be prevented from flooding over the second dam portion 120 to generate an edge tail. Also, during a process of depositing the intermediate layer 320 by using a mask, the second dam portion 120 maintains a separation between the mask and the substrate 100 to prevent the intermediate layer 320 from being chopped or torn by the mask during the deposition process.

The first layer 109b of the second dam portion 120 may clad an end portion of the second power voltage line 20 to prevent the second power voltage line 20 from being deteriorated during wet etching.

The first inorganic encapsulation layer 410 and the second inorganic encapsulation layer 430 cover the first dam portion 110 and the second dam portion 120 beyond the display area DA and the area in which the second hole TH2 is formed, and extend to an edge portion of the substrate 100. The first inorganic encapsulation layer 410 may directly contact the second inorganic encapsulation layer 430 outside the second dam portion 120 to prevent external moisture or impurities from propagating into the display device through the organic encapsulation layer 420.

According to the present exemplary embodiment, the second hole TH2 formed in the first non-display area NDA1 may prevent exfoliation of the thin-film encapsulation layer 400 by reinforcing adhesion strength between the thin-film encapsulation layer 400 and the back plane as described above. Also, since an opening space is formed in a direction perpendicular to the substrate 100 by a depth of the second hole TH2 formed in the second spacer 115-2 and the pixel-defining layer 113, the second hole TH2 may reduce reflow velocity of an organic insulating material during a process of forming the organic encapsulation layer 420 by using the organic insulating material having fluidity.

The organic encapsulation layer 420 may be prevented from flooding over the second dam portion 120 to generate an edge tail at an edge of the substrate 100 by forming the height of the second dam portion 120 higher than the height of the first dam portion 110. However, in the case where an interval between first dam portion 110 and the second dam portion 120 is reduced to reduce a width of a dead space, it may be difficult to control a reflow velocity of the organic encapsulation layer 420, and the organic encapsulation layer 420 may flood over the second dam portion 120. In this case, without the second holes TH2, the first and second dam portions 110 and 120 may not be sufficient to prevent the organic insulating material of the organic encapsulation layer 420 from flooding over the second dam portion 120 to generate an edge tail at an edge of the substrate 100.

The second holes TH2 according to the present exemplary embodiment are a plurality of opening spaces formed between the display area DA and the first dam portion 110. The second holes TH2 may prevent the generation of the edge tail due to the organic insulating material by reducing a reflow velocity of the organic insulating material flowing in an edge direction of the substrate 100 and allowing the organic insulating material to be sufficiently hardened before the organic insulating material reaches the second dam portion 120.

Figure 9:
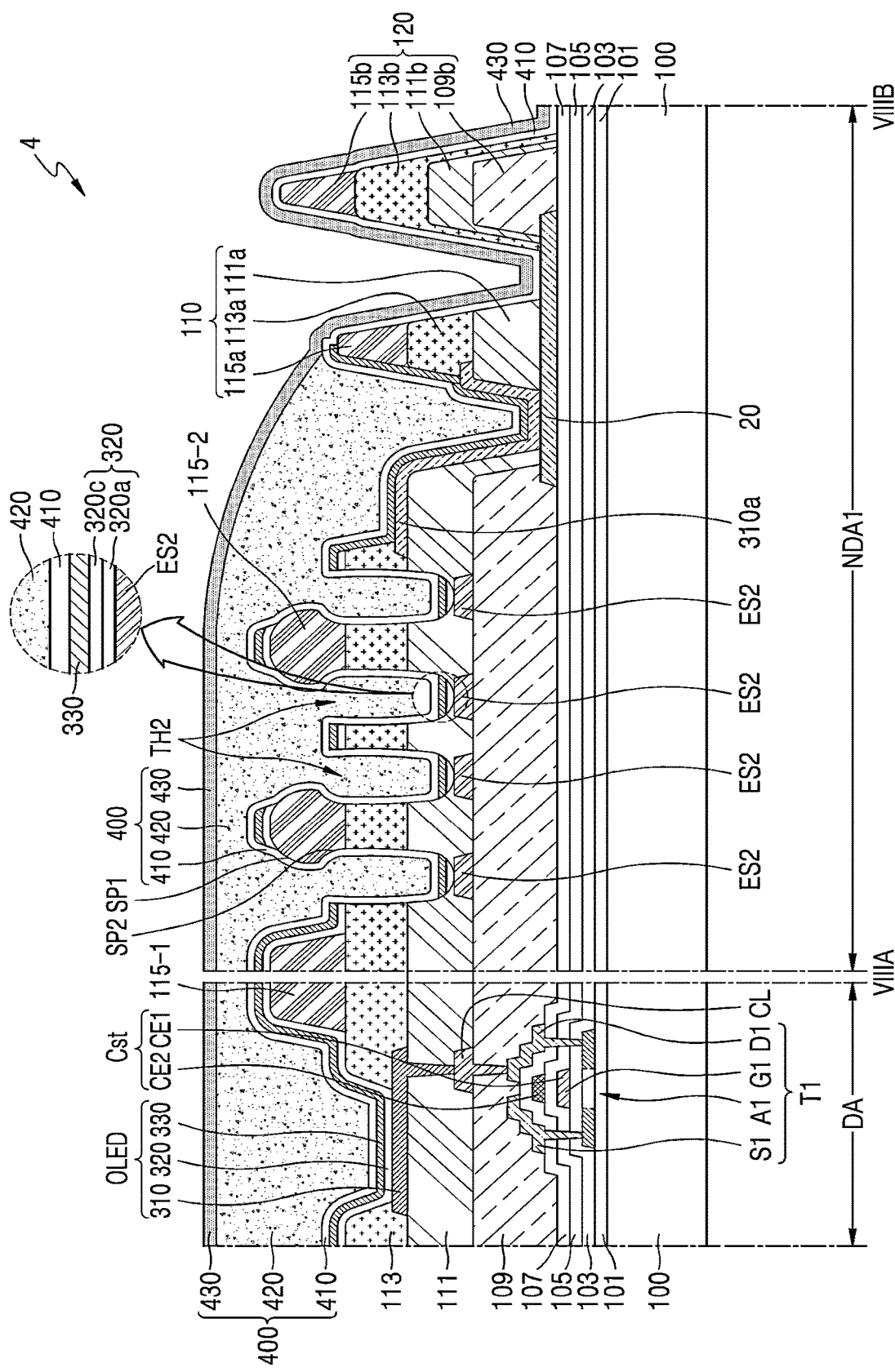
FIG. 9 is a cross-sectional view of a portion of a display device according to an exemplary embodiment of the present disclosure.

FIG. 9 is a cross-sectional view of a portion of a display device 4 according to an exemplary embodiment of the present disclosure. Hereinafter, differences between the exemplary embodiment of FIG. 9 and the exemplary embodiment of FIG. 8 are mainly described.

Referring to FIG. 9, the plurality of second holes TH2 are formed in the first non-display area NDA1, and the first dam portion 110 and the second dam portion 120 are located outside the second hole TH2.

A second etching prevention layer ES2 is located on the first planarization layer 109 extending from the display area DA to the first non-display area NDA1. For example, the second etching prevention layer ES2 may be arranged under a bottom surface of the second hole TH2. The second hole TH2 is not only formed in the second portion SP2, which is the bottom region of the second spacer 115-2, and the pixel-defining layer 113, but also extends into the second planarization layer 111. In addition, the second hole TH2 may extend to the second etching prevention layer ES2, for example, to a top surface of the second etching prevention layer ES2.

The second etching prevention layer ES2 may be apart from the connection line CL, may include a material the same as that of the connection line CL, and may be formed during a process the same as a process of forming the connection line CL. The second etching prevention layer ES2 may prevent the deterioration of the first planarization layer 109 and various wirings, an electrode, a circuit, etc. of the display device 4 that are arranged thereunder during a process of forming the second hole TH2, for example, while the opening space of the second hole TH2 is formed by dry etching.

In the present exemplary embodiment, the intermediate layer 320 and the opposite electrode 330 are formed on the bottom surface of the second hole TH2, and the intermediate layer 320 may include the first functional layer 320a and the second functional layer 320c and may not include the emission layer 320b. Also, the first inorganic encapsulation layer 410 is not only stacked on the bottom surface of the second hole TH2 above the opposite electrode 330 but also continuously formed on the entire inner surface of the second hole TH2 including the bottom surface of the second hole TH2 and outside the second hole TH2, and the organic encapsulation layer 420 fills the inner portion of the second hole TH2. Therefore, adhesive force of the thin-film encapsulation layer 400 may be reinforced. For example, a plurality of second holes TH2 may serve as anchors for the thin-film encapsulation layer 400 in the first non-display area NDA1, and may reinforce adhesive force between the thin-film encapsulation layer 400 and the back plane, thereby reducing an exfoliation defect of the thin-film encapsulation layer 400.

Since the second holes TH2 are formed in the first non-display area NDA1, a greater number of holes per unit area may be formed at high density without space limitation, and a reflow velocity of the organic insulating material may be reduced by making a depth of the second hole TH2 deeper. Accordingly, the second holes TH2 with deeper depth may prevent the generation of the edge tail due to the organic insulating material by reducing a reflow velocity of the organic insulating material flowing in an edge direction of the substrate 100 and allowing the organic insulating material to be sufficiently hardened before the organic insulating material reaches the second dam portion 120, during the process of forming the organic encapsulation layer 420 including the organic insulating material.

Figure 10:
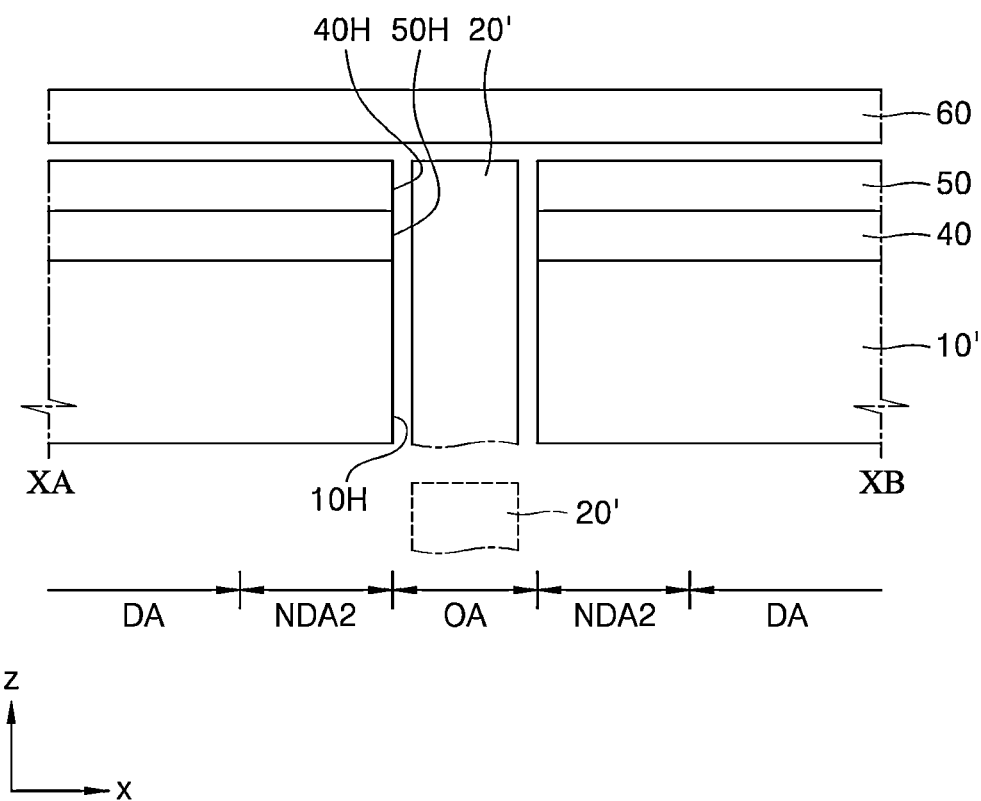
FIG. 10 is a cross-sectional view of the display device taken along line XA-XB of FIG. 1.
Figure 11:
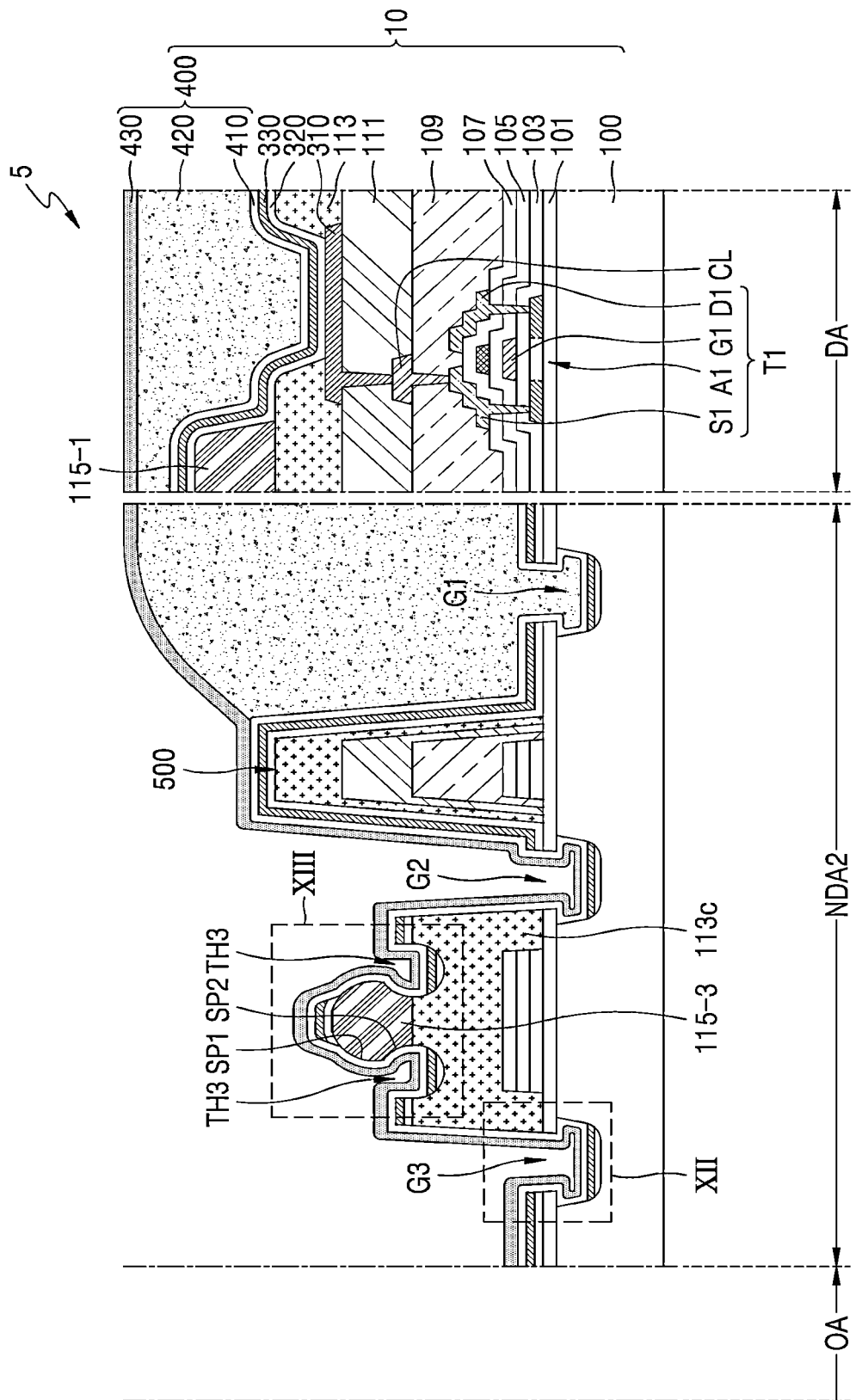
FIG. 11 is a cross-sectional view of a portion of a display device according to an exemplary embodiment of the present disclosure.
Figure 12:
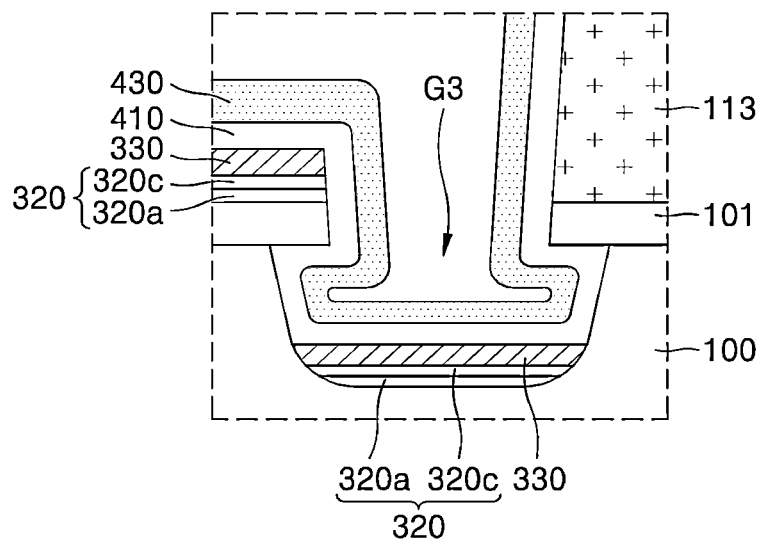
FIG. 12 is a cross-sectional view of region XII of FIG. 11.
Figure 13:
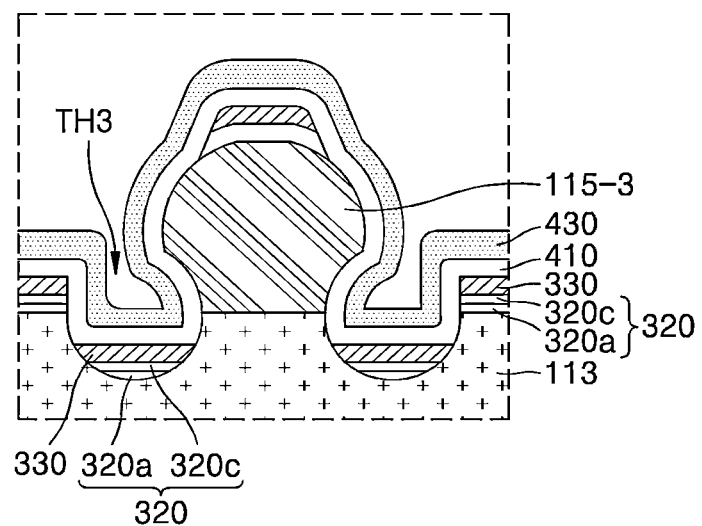
FIG. 13 is a cross-sectional view of region XIII of FIG. 11.

FIG. 10 is a cross-sectional view of the display device taken along line XA-XB of FIG. 1, FIG. 11 is a cross-sectional view of a portion of a display device 5 according to an exemplary embodiment of the present disclosure, FIG. 12 is a cross-sectional view of region XII of FIG. 11, and FIG. 13 is a cross-sectional view of region XIII of FIG. 11. Hereinafter, differences between the exemplary embodiment of FIG. 11 and the exemplary embodiment of FIG. 4 are mainly described.

Referring to FIG. 10, the display device 5 (see FIG. 11) may include an input sensing layer 40, an optical functional layer 50, and a window 60 each arranged on a display panel 10', with the window 60 covering the input sensing layer 40 and the optical functional layer 50.

The display panel 10' may be understood as a structure including the back plane and the thin-film encapsulation layer 400 in the display devices 1, 2, 3, and 4 of the previous exemplary embodiments. The input sensing layer 40 arranged on the display panel 10' may obtain coordinate information corresponding to an external input, for example, a touch event, and the optical functional layer 50 may include a reflection prevention layer including a phase retarder and a polarizer. The input sensing layer 40 may sense an external input according to a mutual capacitance method or a self-capacitance method. For example, the input sensing layer 40 may obtain information on the external input through a change in capacitance between two sensing electrodes. Although the input sensing layer 40 is located between the display panel 10' and the optical functional layer 50 as shown in FIG. 10, the present disclosure is not limited thereto. For example, in an exemplary embodiment of the present disclosure, the input sensing layer 40 may be located over the optical functional layer 50.

In an exemplary embodiment of the present disclosure, the optical functional layer 50 may include a black matrix and a color filter, and may include a lens layer. The color filters may be arranged by taking into account the colors of light beams emitted by the pixels of the display panel 10'. Thus, the desired color may be realized by filtering the light emitted by each of the pixels with the color filter. The lens layer may enhance the emission efficiency or reduce color deviation of light emitted from the display panel 10'. In an exemplary embodiment of the present disclosure, an array of lenses of the lens layer may cover an array of pixels, in which at least one of the lenses may cover at least one of the pixels.

Openings 10H, 40H, and 50H may be formed in an opening area OA surrounded by the display area DA, the openings 10H, 40H, and 50H respectively passing through the display panel 10', the input sensing layer 40, and the optical functional layer 50.

Various components 20' such as, for example, a sensor, a camera, a speaker, a lamp, etc. may be arranged in the opening area OA. The component 20' may detect an external object received through the opening area OA or provide a sound signal such as voice to the outside through the opening area OA. In addition, the component 20' may include a plurality of configurations, and is not limited to any one exemplary embodiment. Also, as shown in a dotted line, the component 20' may be arranged below the display panel 10'. In this case, at least one of the display panel 10', the input sensing layer 40, or the optical functional layer 50 may not include an opening.

Although FIGS. 1 and 10 show a structure in which one circular opening area OA is entirely surrounded by the display area DA, the present disclosure is not limited thereto. For example, the number of opening areas OA, the shape and the arrangement of the opening area OA may be variously changed. For example, in an exemplary embodiment of the present disclosure, the shape of the opening area OA may be modified in various ways such as, for example, a circular shape, an elliptical shape, a polygonal shape, a star shape, or a diamond shape. When two or more opening areas OA are provided, the opening areas OA may have the same shape or different shapes, and may have the same size or different sizes. Also, the second non-display area NDA2 may be located around the opening area OA, and the second non-display area NDA2 may be surrounded by the display area DA.

Referring to FIG. 11, according to the present exemplary embodiment, a plurality of third holes TH3 and a plurality of grooves G1, G2, and G3 are formed in the second non-display area NDA2. Like the exemplary embodiment of FIG. 4, the first holes TH1 may be formed in the display area DA in the present exemplary embodiment, and like the exemplary embodiment of FIG. 8, the second holes TH2 may be formed in the first non-display area NDA1 in the present exemplary embodiment. However, the present exemplary embodiment mainly describes the case where the third holes TH3 are formed in the second non-display area NDA2 surrounding the opening area OA.

A partition wall 500 may be located in the second non-display area NDA2, with the partition wall 500 including the first planarization layer 109, the second planarization layer 111, and the pixel-defining layer 113 each extending from the display area DA.

The partition wall 500 may surround the opening area OA, and may prevent the organic encapsulation layer 420 from penetrating into the opening area OA by controlling the reflow of the organic encapsulation layer 420, thereby preventing external impurities from progressing to the display area DA through the organic encapsulation layer 420 through the opening area OA. The number of partition walls 500, the height and the material of the partition wall 500 are not limited to those of FIG. 11 and may be variously changed.

A third spacer 115-3 may be located on a base layer 113c in the second non-display area NDA2, with the base layer 113c including a material the same as that of the pixel-defining layer 113. The third spacer 115-3 may include a material the same as that of the first spacer 115-1. Also, the third spacer 115-3 may include a material the same as that of the second spacer 115-2 (see FIG. 8).

The third hole TH3 is formed to pass through a portion of the third spacer 115-3 and a portion of the base layer 113c, and may have a predetermined opening space. A structure of the third hole TH3 is similar to the structure of the first hole TH1. For example, a first portion SP1, which is a top region of the third spacer 115-3, may be a forward-tapered shape, and a second portion SP2, which is a bottom region of the third spacer 115-3, may be an inverse-tapered shape.

The plurality of grooves G1, G2, and G3 are located in the second non-display area NDA2, with the plurality of grooves G1, G2, and G3 exposing a portion of the substrate 100. The first groove G1, the second groove G2, and the third groove G3 are arranged in a sequence close to the display area DA. Although three grooves are shown in FIG. 11, the present disclosure is not limited thereto and the number of grooves may be adjusted. Also, each of the grooves may have a ring shape entirely surrounding the opening area OA in plan view.

Referring to FIGS. 12 and 13, the intermediate layer 320 and the opposite electrode 330 may be formed not only in the display area DA but also in a portion of the second non-display area NDA2 surrounding the opening area OA. The intermediate layer 320 and the opposite electrode 330 may be formed on bottom surfaces of the third hole TH3 and the third groove G3.

The first functional layer 320a and the second functional layer 320c of the intermediate layer 320 may be formed inside the third hole TH3 and the third groove G3, and the emission layer 320b of the intermediate layer 320 may not be formed inside the third hole TH3 and the third groove G3. Like the intermediate layer 320, the opposite electrode 330 is formed on the bottom surfaces of the third hole TH3 and the third groove G3, and is not formed on lateral surfaces of the third hole TH3 and the third groove G3.

The first inorganic encapsulation layer 410 is formed on the opposite electrode 330. The first inorganic encapsulation layer 410 is not only stacked on the bottom surface of the third hole TH3 above the opposite electrode 330 but also formed on the entire inner surface of the third hole TH3 including the bottom surface of the third hole TH3, and extends to the outside of the third hole TH3. Also, the first inorganic encapsulation layer 410 is not only stacked on the bottom surface of the third groove G3 but also formed on the entire inner surface of the third groove G3 including the bottom surface of the third groove G3, and extends to the outside of the third groove G3 to entirely encapsulate the second non-display area NDA2 in cooperation with the first inorganic encapsulation layer 410 extending from the third hole TH3.

Unlike the previous exemplary embodiments, according to the present exemplary embodiment, the second inorganic encapsulation layer 430 is connected inside and outside the third hole TH3 and the third groove G3 without disconnection to entirely encapsulate the second non-display area NDA2. The first inorganic encapsulation layer 410 and the second inorganic encapsulation layer 430 each connected inside and outside the third hole TH3 and the third groove G3 without disconnection may reinforce adhesive force of the thin-film encapsulation layer 400 by increasing a contact area thereof. Also, since the first inorganic encapsulation layer 410 and the second inorganic encapsulation layer 430 extend to the opening area OA without the organic encapsulation layer 420, external impurities through the opening area OA may be prevented from progressing to the display area DA through the organic encapsulation layer 420.

In this case, only the first inorganic encapsulation layer 410 may be connected without disconnection inside and outside the first groove G1 formed between the partition wall 500 and the display area DA, and the organic encapsulation layer 420 may fill the inner portion of the first groove G1.

In the case where an adhesive layer including an organic insulating material is further formed on the second inorganic encapsulation layer 430 of the display panel 10', the adhesive layer may fill an inner portion of the third hole TH3 and the third groove G3 to reinforce adhesive force between the adhesive layer and the display panel 10'. For example, the third hole TH3 and the third groove G3 may serve as anchors for the thin-film encapsulation layer 400 and the adhesive layer in the second non-display area NDA2, and may reinforce adhesive force between the adhesive layer/the thin-film encapsulation layer 400 and the back plane, thereby reducing an exfoliation defect of the thin-film encapsulation layer 400 and the adhesive layer.

Hereinafter, a manufacturing process of forming the third hole TH3 of FIG. 11 is described with reference to FIGS. 14A to 14F.

FIGS. 14A to 14F are cross-sectional views of a process of manufacturing the display device of FIG. 11 according an exemplary embodiment of the present disclosure.

Figure 14A:
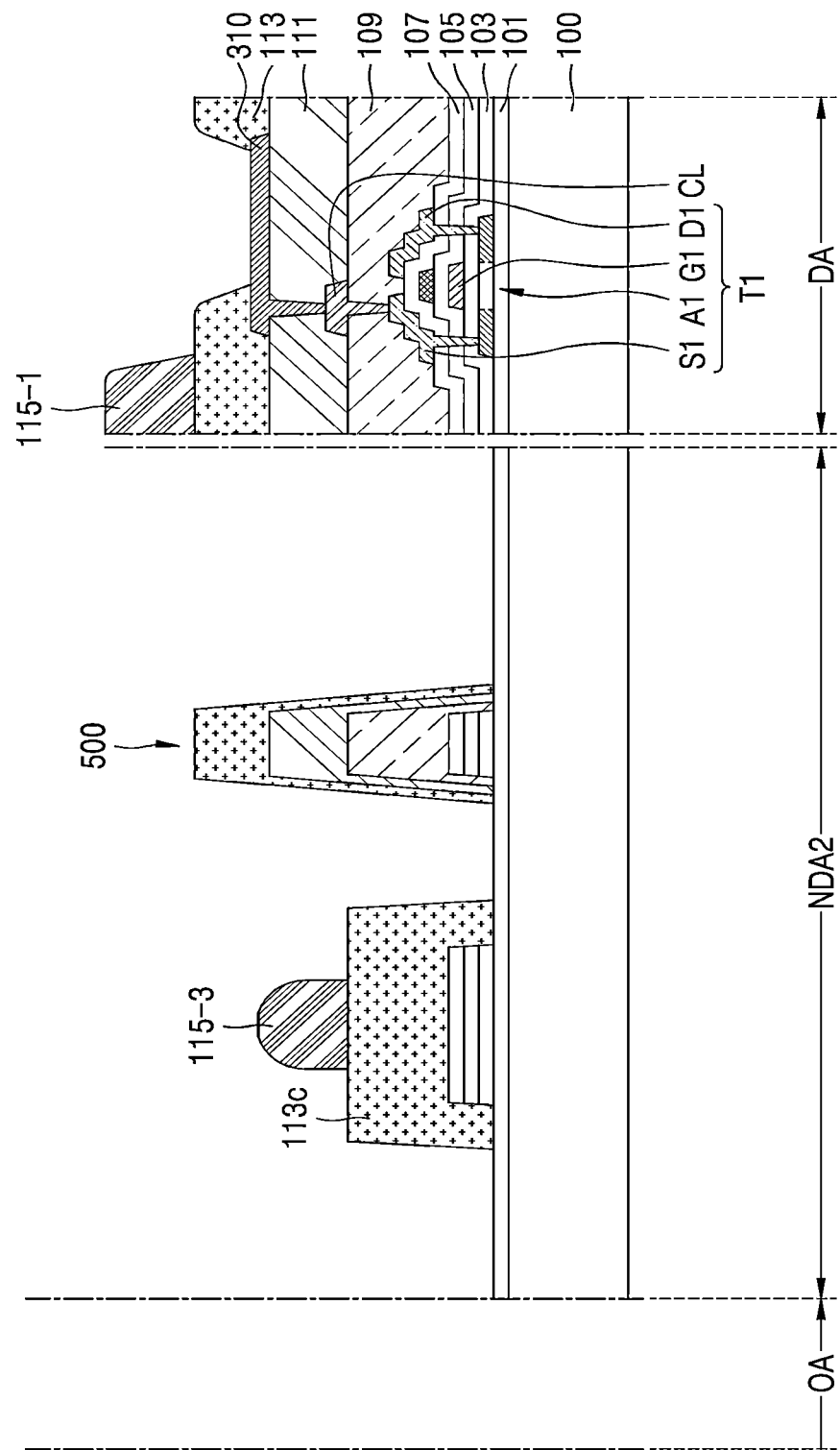
FIGS. 14A to 14F are cross-sectional views of a process of manufacturing the display device of FIG. 11 according to an exemplary embodiment of the present disclosure.

Referring to FIG. 14A, the partition wall 500 is formed in the second non-display area NDA2, with the partition wall 500 including the first planarization layer 109, the second planarization layer 111, and the pixel-defining layer 113 each extending from the display area DA. The third spacer 115-3 is formed on the base layer 113c including a material the same as that of the pixel-defining layer 113 in the display area DA.

Although it is shown in FIG. 14A that the base layer 113c and the third spacer 115-3 are expressed as different layers with different hatchings, the present disclosure is not limited thereto. For example, the base layer 113c and the third spacer 115-3 may include the same material. For example, the base layer 113c and the third spacer 115-3 may be simultaneously formed by using a halftone mask during the same process.

Figure 14B:
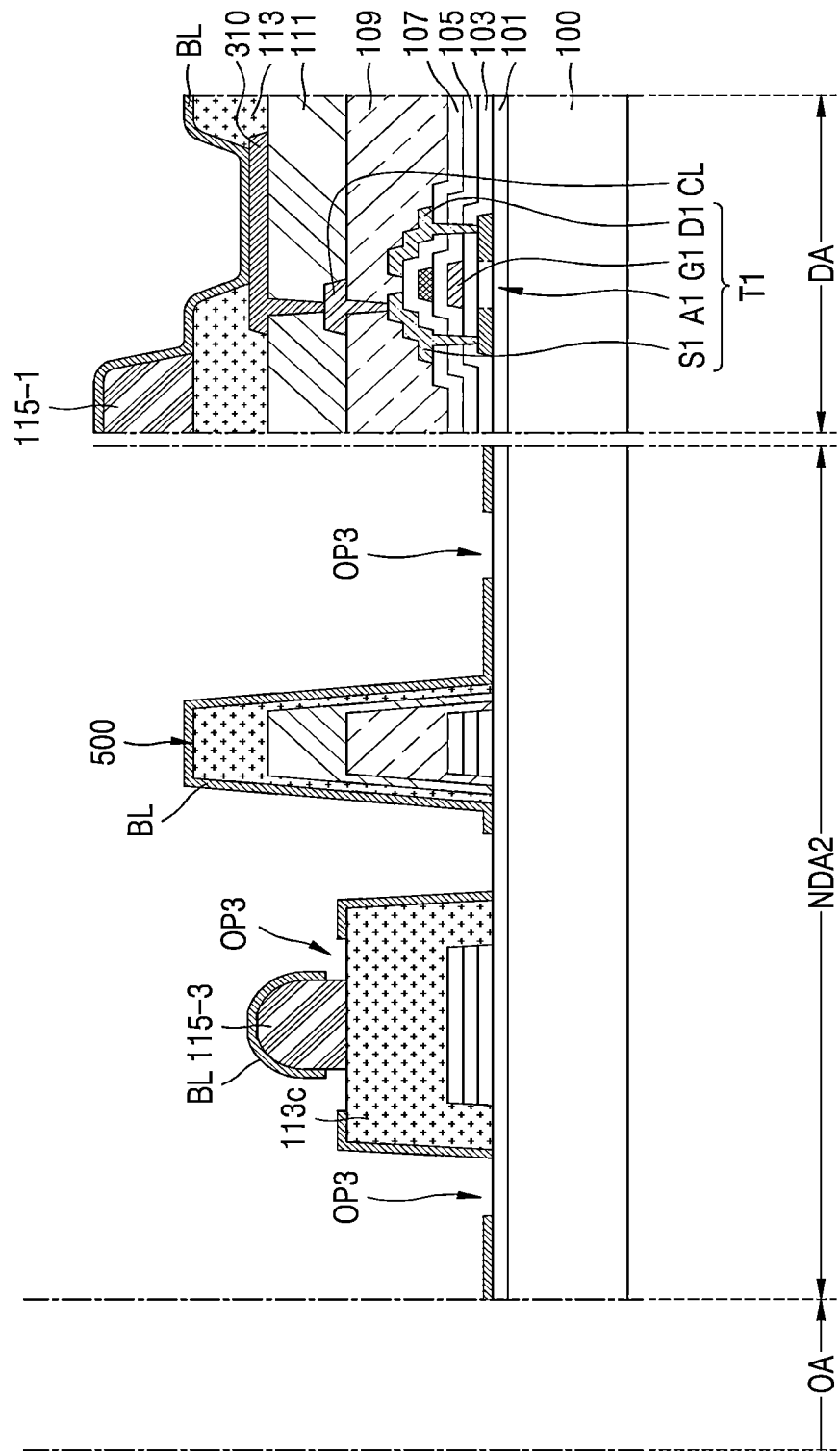

Referring to FIG. 14B, a barrier layer BL is formed on the structure of FIG. 14A by a deposition process, and a third opening OP3 is formed by patterning the barrier layer BL, with the third opening OP3 exposing a portion of the base layer 113c and a partial surface of a bottom region of the third spacer 115-3. In this case, a third opening OP3 exposing a partial surface of the buffer layer 101 on the substrate 100 is simultaneously formed.

Figure 14C:
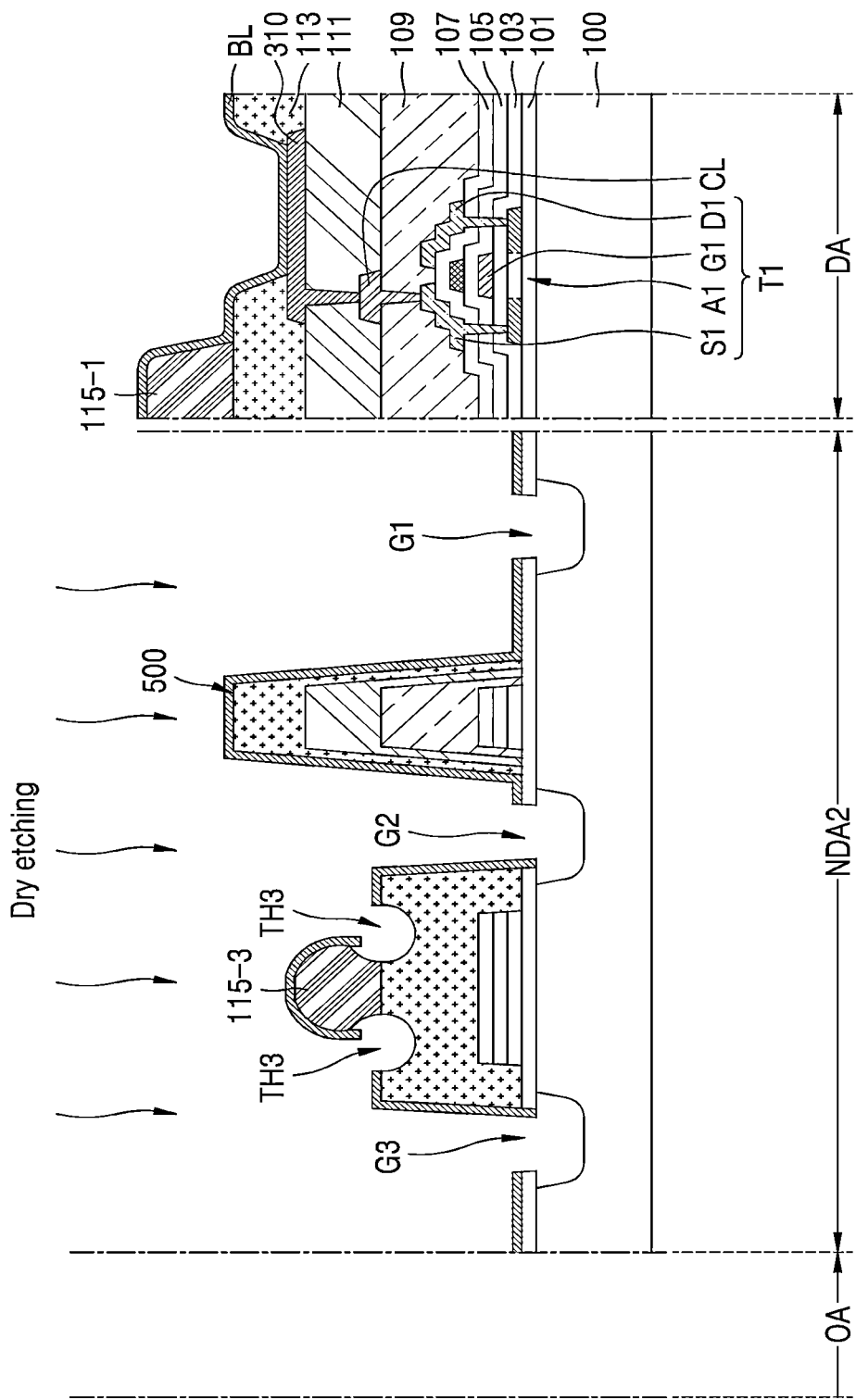

Referring to FIG. 14C, the third hole TH3 is formed by etching a portion of the base layer 113c and a portion of the third spacer 115-3 each corresponding to the third opening OP3 using the barrier layer BL as an etch mask, and the first to third grooves G1, G2, and G3 are formed by etching a portion of the buffer layer 101 and a portion of the substrate 100 each corresponding to the third opening OP3 using the barrier layer BL as an etch mask. The third hole TH3 and the first to third grooves G1, G2, and G3 may be formed by dry etching.

Figure 14D:
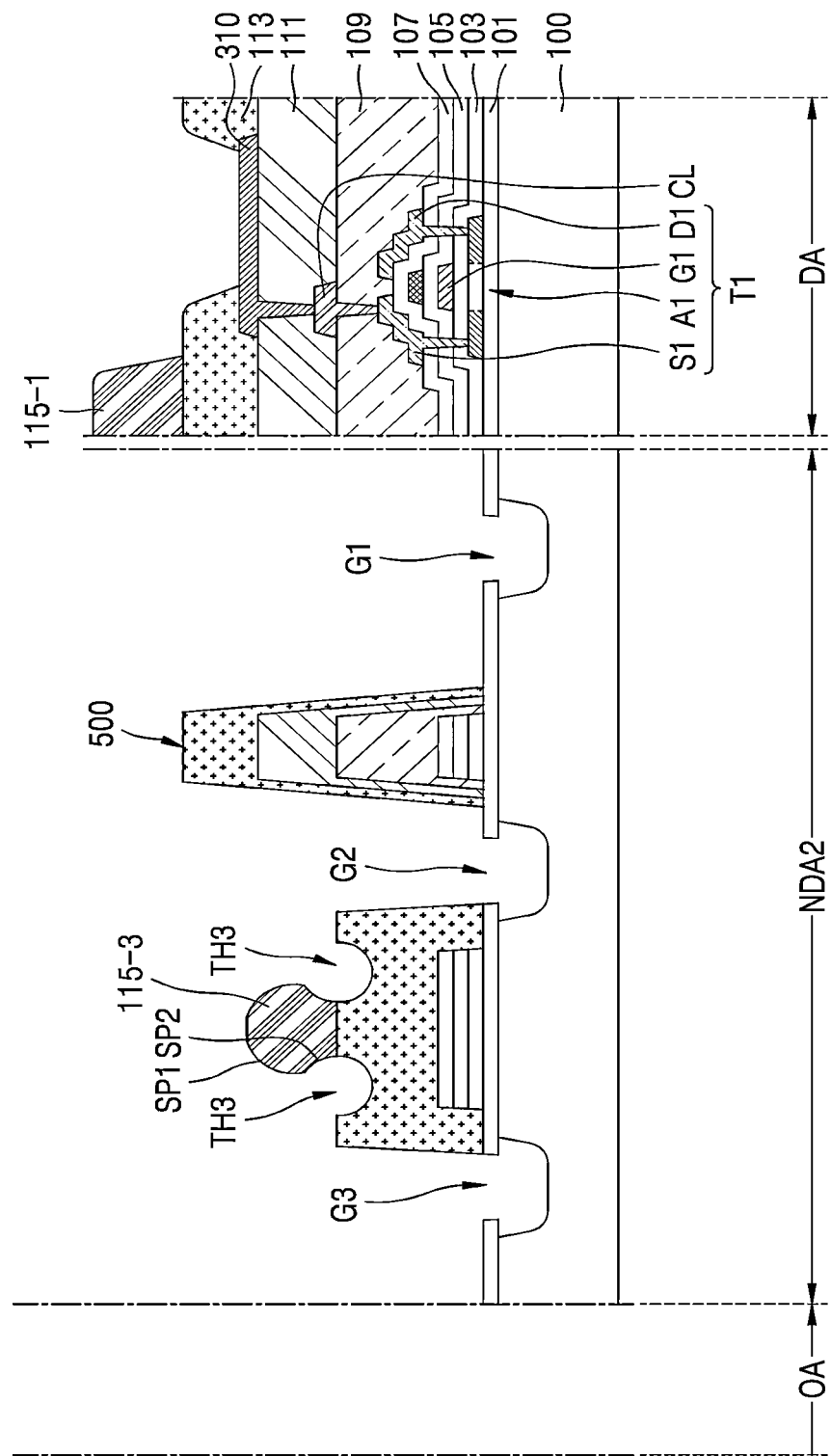

Referring to FIG. 14D, the barrier layer BL is removed by wet etching.

The second portion SP2 of the third spacer 115-3, which is dry-etched, may have an inverse-tapered shape, and the first portion SP1 of the third spacer 115-3, which is not etched, may have a forward-tapered shape. Therefore, the third hole TH3 may have an undercut shape UC in which the first portion SP1 further protrudes than the second portion SP2 at an interface between the first portion SP1 and the second portion SP2 of the third spacer 115-3.

End portions of the buffer layer 101 may further protrude than lateral sides of the substrate 100 with respect to a surface on which the buffer layer 101 contacts the substrate 100 in a region in which the first to third grooves G1, G2, and G3 are formed. Therefore, the buffer layer 101 may have an undercut shape.

Figure 14E:
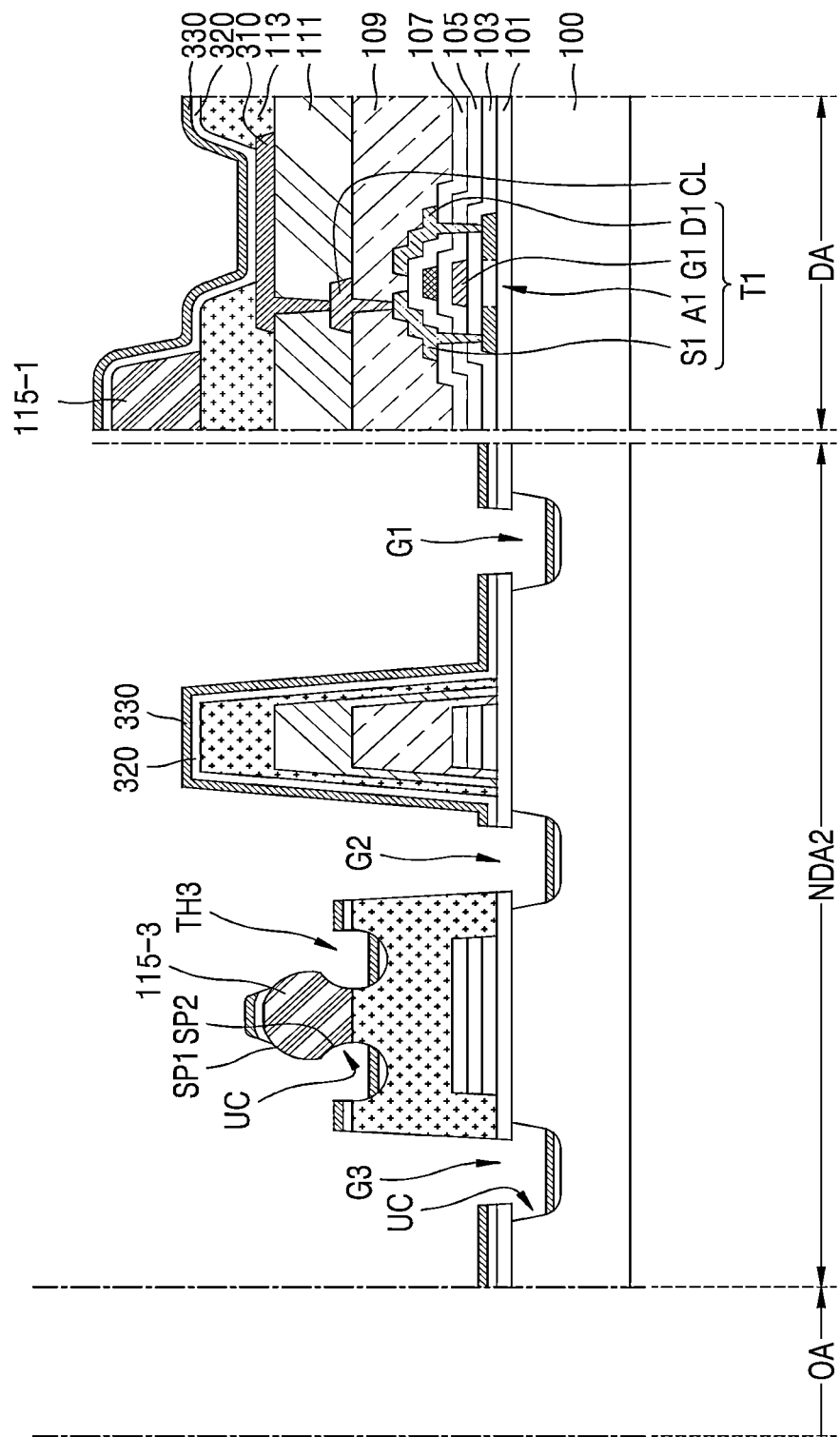

Referring to FIG. 14E, the intermediate layer 320 and the opposite electrode 330 are deposited on the structure of FIG. 14D.

The intermediate layer 320 and the opposite electrode 330 may be formed on a bottom surface of each of the third hole TH3 and the first to third grooves G1, G2, and G3 and may be disconnected without being connected to the outside of the third hole TH3 and the first to third grooves G1, G2, and G3. The intermediate layer 320 formed in the third hole TH3 and the first to third grooves G1, G2, and G3 may include the first functional layer 320a and the second functional layer 320c and may not include the emission layer 320b.

The intermediate layer 320 and the opposite electrode 330 may be formed by physical vapor deposition (PVD) which has poor step coverage. Thus, the intermediate layer 320 and the opposite electrode 330 may be non-conformally formed on the bottom surfaces of the third hole TH3 and the first to third grooves G1, G2, and G3, and on other surfaces outside the third hole TH3 and the first to third grooves G1, G2, and G3. For example, the intermediate layer 320 and the opposite electrode 330 may be formed by one of, for example, sputtering, thermal evaporation, E-beam evaporation, laser molecular beam epitaxy, or pulsed laser deposition.

Figure 14F:
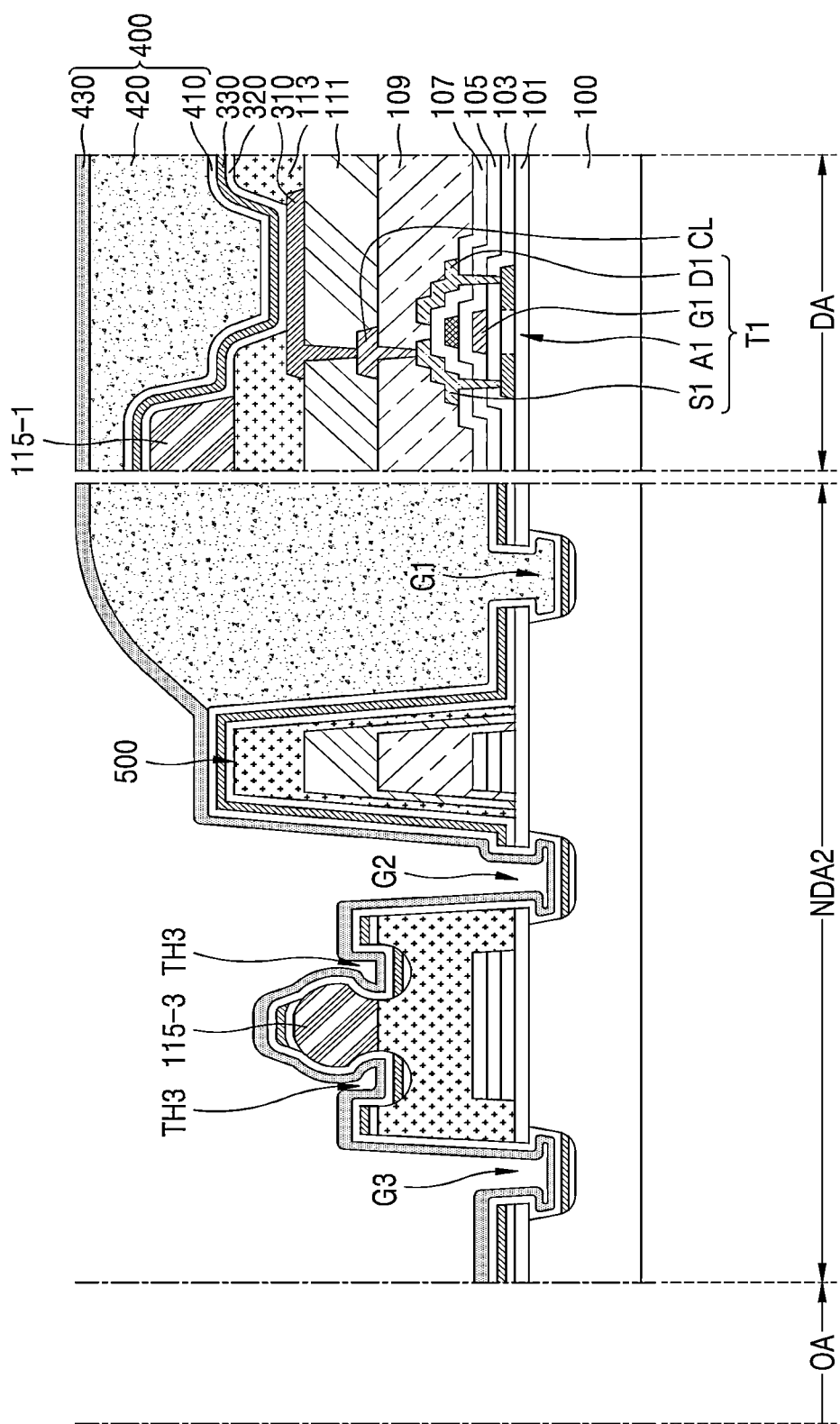

Referring to FIG. 14F, the thin-film encapsulation layer 400 is formed on the structure of FIG. 14E, with the thin-film encapsulation layer 400 including the first inorganic encapsulation layer 410, the organic encapsulation layer 420, and the second inorganic encapsulation layer 430.

The first inorganic encapsulation layer 410 is not only stacked on the bottom surface of each of the third hole TH3 and the first to third grooves G1, G2, and G3 but also formed on an entire inner surface of each of the third hole TH3 and the first to third grooves G1, G2, and G3. Also, the first inorganic encapsulation layer 410 is formed on a top surface of the base layer 113c outside the third hole TH3 and on a top surface and lateral sides of the third spacer 115-3. Also, the first inorganic encapsulation layer 410 is formed on a top surface of the buffer layer 101 outside the first to third grooves G1, G2, and G3. That is, despite the undercut UC, the first inorganic encapsulation layer 410 may be continuously formed without disconnection inside and outside the third hole TH3 and the first to third grooves G1, G2, and G3.

The first inorganic encapsulation layer 410 may be formed by chemical vapor deposition (CVD) or atomic layer deposition (ALD) having excellent step coverage compared to physical vapor deposition (PVD). Thus, the first inorganic encapsulation layer 410 may be conformally formed on the entire inner surfaces of the third hole TH3 and the first to third grooves G1, G2, and G3, and on other surfaces outside the third hole TH3 and the first to third grooves G1, G2, and G3. For example, the first inorganic encapsulation layer 410 may be formed by one of, for example, thermal CVD, plasma CVD, metal-organic (MO) CVD, or hydride vapor phase epitaxy (HVPE).

After the first inorganic encapsulation layer 410 is formed, the organic encapsulation layer 420 is formed. The organic encapsulation layer 420 is adjusted by the partition wall 500 and does not flood over the partition wall 500. The organic encapsulation layer 420 may fill an entire inner portion of the first groove G1.

After the organic encapsulation layer 420 is formed, the second inorganic encapsulation layer 430 is formed. The second inorganic encapsulation layer 430 may include a material the same as that of the first inorganic encapsulation layer 410, and may be formed using a process the same as a process of forming the first inorganic encapsulation layer 410. The second inorganic encapsulation layer 430 is not only stacked on the bottom surface of each of the third hole TH3 and the second and third grooves G2 and G3 above the first inorganic encapsulation layer 410 but also formed on an entire inner surface of each of the third hole TH3 and the second and third grooves G2 and G3. Also, the second inorganic encapsulation layer 430 is formed on a top surface of the base layer 113c outside the third hole TH3 and on a top surface and lateral sides of the third spacer 115-3. Also, the second inorganic encapsulation layer 430 is formed on a top surface of the buffer layer 101 outside the first to third grooves G1, G2, and G3. That is, despite the undercut UC, the second inorganic encapsulation layer 430 may be continuously formed without disconnection inside and outside the third hole TH3 and the second and third grooves G2 and G3.

According to the exemplary embodiments of the present disclosure described above, exfoliation of the thin-film encapsulation layer may be prevented by forming a plurality of holes in the display area and/or the non-display area and reinforcing adhesive strength between the thin-film encapsulation layer and the back plane. However, the scope of the present disclosure is not limited by this effect.

It should be understood that the exemplary embodiments of the present disclosure described herein should be considered in a descriptive sense only and not for purposes of limitation. Descriptions of features or aspects within each exemplary embodiment should typically be considered as available for other similar features or aspects in other exemplary embodiments. While the exemplary embodiments have been described with reference to the figures, it will be understood by those of ordinary skill in the art that various changes in form and details may be made therein without departing from the spirit and scope of the present disclosure as defined by the appended claims.

What is claimed is:

1. A display device comprising:
a display area located over a substrate, the display area including a plurality of pixels of which each includes a first electrode, a second electrode, and an intermediate layer including an emission layer and arranged between the first electrode and the second electrode;
a pixel-defining layer covering edges of the first electrode of each of the plurality of pixels;
a spacer arranged on the pixel-defining layer and including a first portion and a second portion, and the second portion of the spacer being arranged between the first portion of the spacer and the pixel-defining layer;
a first planarization layer arranged between the pixel-defining layer and the substrate;
a second planarization layer arranged between the first planarization layer and the pixel-defining layer; and
a hole arranged apart from the first electrode in the display area, the hole being formed in the second portion of the spacer and the pixel-defining layer and extending into the second planarization layer,
wherein the hole has a first upper end and a second upper end, a first height of the first upper end from the substrate being different from a second height of the second upper end from the substrate.

2. The display device of claim 1, further comprising an etching prevention layer arranged under a bottom surface of the hole.

3. The display device of claim 2, further comprising:
a thin film transistor located between the substrate and the first planarization layer; and
a connection line located between the first planarization layer and the second planarization layer and configured to connect the thin film transistor to the first electrode, wherein the etching prevention layer includes a material the same as that of the connection line.

4. The display device of claim 1, wherein the first portion of the spacer has a width increasing toward the substrate and the second portion of the spacer has a width decreasing toward the substrate.

5. The display device of claim 4, wherein the first height is the same as a height of a top surface of the pixel-defining layer from the substrate and the second height is the same as a height of the top surface of the second portion of the spacer from the substrate.

6. The display device of claim 5, wherein the first height is greater than the second height.

7. The display device of claim 1, wherein
the intermediate layer further comprises a first functional layer and a second functional layer, the emission layer being arranged between the first functional layer and the second functional layer, and
the first functional layer, the second functional layer, and the second electrode are located inside the hole, and the emission layer is not located inside the hole.

8. A display device comprising:
a display area located over a substrate, the display area including a plurality of pixels of which each includes a first electrode, a second electrode, and an intermediate layer including an emission layer and arranged between the first electrode and the second electrode;
a pixel-defining layer covering edges of the first electrode of each of the plurality of pixels;
a spacer arranged on the pixel-defining layer;
a planarization layer arranged between the pixel-defining layer and the substrate;
a thin-film encapsulation layer arranged on the pixel-defining layer and the spacer and including a first inorganic encapsulation layer, a second inorganic encapsulation layer, and an organic encapsulation layer located between the first inorganic encapsulation layer and the second inorganic encapsulation layer;
a hole arranged apart from the first electrode, the hole being formed in the spacer and the pixel-defining layer and extending into the planarization layer; and
an etching prevention layer arranged under a bottom surface of the hole,
wherein the intermediate layer and/or the second electrode are located inside of the hole and on a top of the spacer, and the intermediate layer and/or the second electrode are not connected between the inside of the hole and the top of the spacer, and
the intermediate layer contacts the etching prevention layer.

9. The display device of claim 8, wherein the first inorganic encapsulation layer is continuously located inside of the hole and the top of the spacer.

10. The display device of claim 8, wherein the organic encapsulation layer fills an entire inside of the hole.

11. The display device of claim 8, further comprising a non-display area located outside the display area,
wherein the spacer and the hole are located in the display area and/or the non-display area.

12. The display device of claim 8, wherein
the planarization layer includes a first planarization layer and a second planarization layer, the first planarization layer being arranged between the pixel-defining layer and the substrate, and the second planarization layer being arranged between the first planarization layer and the pixel-defining layer, and
the etching prevention layer is located between the first planarization layer and the second planarization layer.

13. A display device comprising:
a display area located over a substrate and including a plurality of pixels, each of the plurality of pixels including a first electrode, a second electrode, and an intermediate layer including an emission layer and located between the first electrode and the second electrode;
a non-display area located over the substrate and located outside the display area;
a thin-film encapsulation layer encapsulating the plurality of pixels and including a first inorganic encapsulation layer, a second inorganic encapsulation layer, and an organic encapsulation layer located between the first inorganic encapsulation layer and the second inorganic encapsulation layer;
a pixel-defining layer covering edges of the first electrode and extending from the display area to the non-display area;
a first spacer located on the pixel-defining layer in the display area;
a second spacer located on the pixel-defining layer in the non-display area, including a material the same as that of the first spacer, and including a first portion and a second portion, the first portion of the second spacer having a width increasing toward the substrate, and the second portion of the second spacer being arranged between the first portion of the second spacer and the substrate and having a width decreasing toward the substrate;

a planarization layer arranged between the pixel-defining layer and the substrate; and a hole located in the non-display area, the hole being formed in the second portion of the second spacer and the pixel-defining layer and extending into the planarization layer.

14. The display device of claim 13, further comprising an etching prevention layer arranged under a bottom surface of the hole.

15. The display device of claim 14, wherein the intermediate layer contacts the etching prevention layer.

16. The display device of claim 14, wherein the planarization layer includes a first planarization layer and a second planarization layer, the first planarization layer being arranged between the pixel-defining layer and the substrate, and the second planarization layer being arranged between the first planarization layer and the pixel-defining layer, and the etching prevention layer is located between the first planarization layer and the second planarization layer.

17. The display device of claim 13, wherein the first portion of the second spacer has a width increasing toward the substrate and the second portion of the second spacer has a width decreasing toward the substrate.

18. The display device of claim 13, wherein the intermediate layer and the second electrode extend to the non-display area, the intermediate layer further comprises a first functional layer and a second functional layer, the emission layer being arranged between the first functional layer and the second functional layer, and the first functional layer, the second functional layer, and the second electrode are located inside the hole, and the emission layer is not located inside the hole.

19. The display device of claim 18, wherein the first inorganic encapsulation layer, the organic encapsulation layer, and the second inorganic encapsulation layer extend to the non-display area, the first inorganic encapsulation layer covers the second electrode located inside the hole and the entire inner surface of the hole, and the organic encapsulation layer fills the entire inner portion of the hole.

20. The display device of claim 13, wherein the first inorganic encapsulation layer is continuously located inside of the hole and the top of the second spacer.

* * * * *